US012564012B2

(12) United States Patent
Natu et al.

(10) Patent No.: US 12,564,012 B2
(45) Date of Patent: Feb. 24, 2026

(54) ULTRATHIN CONFORMAL COATINGS FOR ELECTROSTATIC DISSIPATION IN SEMICONDUCTOR PROCESS TOOLS

(71) Applicant: APPLIED MATERIALS, INC., Santa Clara, CA (US)

(72) Inventors: Gayatri Natu, Mumbai (IN); Geetika Bajaj, Mumbai (IN); Prerna Goradia, Mumbai (IN); Darshan Thakare, Thane West (IN); David Fenwick, Los Altos Hills, CA (US); XiaoMing He, Fremont, CA (US); Sanni Seppaelae, Karlstein am Main (DE); Jennifer Sun, Fremont, CA (US); Rajkumar Thanu, Santa Clara, CA (US); Jeff Hudgens, San Francisco, CA (US); Karuppasamy Muthukamatchy, Bangalore (IN); Arun Dhayalan, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/648,278

(22) Filed: Apr. 26, 2024

(65) Prior Publication Data

US 2024/0284650 A1 Aug. 22, 2024

Related U.S. Application Data

(63) Continuation of application No. 17/985,065, filed on Nov. 10, 2022, now Pat. No. 12,004,337, which is a (Continued)

(30) Foreign Application Priority Data

Sep. 26, 2019 (IN) .............................. 201941038863

(51) Int. Cl.
*H01L 21/687* (2006.01)

(52) U.S. Cl.
CPC .............................. *H01L 21/68757* (2013.01)

(58) Field of Classification Search
USPC .......................................... 361/220; 414/217
See application file for complete search history.

(56) References Cited

U.S. PATENT DOCUMENTS 5,508,071 A 4/1996 Banholzer et al.
6,290,859 B1 * 9/2001 Fleming ................ B81C 1/0096
216/2

(Continued)

FOREIGN PATENT DOCUMENTS

CN 103171215 A 6/2013
JP 2001053135 A 2/2001
(Continued)

OTHER PUBLICATIONS

Office Action for Taiwan Patent Application No. 113127123, mailed Sep. 20, 2024, 8 Pages.
(Continued)

*Primary Examiner* — Kiet T Nguyen
(74) *Attorney, Agent, or Firm* — Lowenstein Sandler LLP

(57) ABSTRACT

A coated chamber component comprises a chamber component and a coating deposited on a surface of the chamber component, the coating comprising an electrically-dissipative material. The electrically-dissipative material is to provide a dissipative path from the coating to a ground. The coating is uniform, conformal, and has a thickness ranging from about 10 nm to about 900 nm.

20 Claims, 8 Drawing Sheets

Related U.S. Application Data continuation of application No. 16/890,336, filed on Jun. 2, 2020, now Pat. No. 11,540,432.

(56) References Cited

U.S. PATENT DOCUMENTS

| | | |
|---|---|---|
| 6,316,734 B1 | 11/2001 | Yang |
| 6,641,939 B1 | 11/2003 | Lee et al. |
| 6,709,218 B1 | 3/2004 | Freerks et al. |
| 9,105,379 B2 | 8/2015 | Elam et al. |
| 11,376,822 B2 | 7/2022 | Simpson et al. |
| 2004/0183135 A1 | 9/2004 | Kwon et al. |
| 2008/0213496 A1 | 9/2008 | Sun et al. |
| 2010/0104403 A1 | 4/2010 | Cho et al. |
| 2015/0311043 A1 | 10/2015 | Sun et al. |
| 2015/0334812 A1 | 11/2015 | Mazzocco et al. |
| 2016/0218029 A1 | 7/2016 | Janakiraman et al. |
| 2016/0244880 A1 | 8/2016 | Thompson et al. |
| 2017/0117170 A1 | 4/2017 | Wong et al. |
| 2017/0159176 A1 | 6/2017 | Zhang et al. |
| 2018/0112311 A1 | 4/2018 | Fenwick et al. |
| 2021/0100087 A1 | 4/2021 | Natu et al. |
| 2021/0100141 A1 | 4/2021 | Natu et al. |

FOREIGN PATENT DOCUMENTS

| | | |
|---|---|---|
| JP | 2002292920 A | 10/2002 |
| JP | 2019522113 A | 8/2019 |
| KR | 100825418 B1 | 4/2008 |
| TW | I441794 B | 6/2014 |
| TW | 201639068 A | 11/2016 |
| TW | 201726509 A | 8/2017 |
| WO | 2012088172 A2 | 6/2012 |

OTHER PUBLICATIONS

Abendroth B., et al., "Atomic Layer Deposition of TiO2 from Tetrakis(Dimethylamino) Titanium and H2O," Elsevier, Thin Solid Films, Jul. 26, 2013, vol. 545, pp. 176-182.

Groner M.D., et al., "Electrical Characterization of Thin Al2O3 Films Grown by Atomic Layer Deposition on Silicon and Various Metal Substrates," Elsevier, Accepted on Apr. 19, 2002, 12 Pages.

International Search Report and Written Opinion for International Application No. PCT/US2020/053036, mailed Jan. 15, 2021, 12 pages.

Ives R.L., et al., "Multipactor Coating for Sapphire RF Windows Using Remote Plasma-Assisted Deposition," IEEE Transactions on Plasma Science, Aug. 2015, vol. 43, No. 8, 10 Pages.

* cited by examiner

ULTRATHIN CONFORMAL COATINGS FOR ELECTROSTATIC DISSIPATION IN SEMICONDUCTOR PROCESS TOOLS

RELATED APPLICATIONS

This application is a continuation of U.S. application Ser. No. 17/985,065, filed Nov. 10, 2022, which is a continuation of U.S. application Ser. No. 16/890,336, filed Jun. 2, 2020, which claims priority to Indian Provisional Patent Application No. 201941038863, filed Sep. 26, 2019, each of which are herein incorporated by reference. This application is additionally related to U.S. application Ser. No. 16/890,346, filed Jun. 2, 2020, which also claims priority to Indian Provisional Patent Application No. 201941038863.

TECHNICAL FIELD

Embodiments of the present disclosure relate generally to coated semiconductor process tools (such as an apparatus for transferring objects in a processing system), electrically-dissipative coatings, and methods for depositing such coatings. In certain embodiments, the present disclosure relates to an end effector of a robot arm coated with an electrically-dissipative material.

BACKGROUND

In electronic device manufacturing, substrates (e.g., silicon-containing wafers, silicon-containing plates) may be moved about manufacturing facilities and within manufacturing equipment tools by robots. The robots can include robot arms having one or more end effectors coupled thereto that may contact and support the substrates during such transportation. End effectors include contact pads thereon that provide elevated contact surfaces upon which the substrates are supported.

SUMMARY OF THE DISCLOSURE

In certain embodiments, the instant disclosure may be directed to a coated chamber component comprising a chamber component and a coating deposited on a surface of the chamber component. In certain embodiments, the coating may comprise an electrically-dissipative material. The electrically-dissipative material may provide a dissipative path from the coating to the ground. The coating may be uniform, conformal, and porosity free. The coating may have a thickness ranging from about 10 nm to about 900 nm and an electrical surface/sheet resistance ranging from about $1\times10^5$ ohm/sq to about $1\times10^{11}$ ohm/sq.

In certain embodiments, the instant disclosure may be directed to a method comprising depositing a coating onto a surface of a chamber component using an atomic layer deposition (ALD) process, a chemical vapor deposition (CVD) process, a plasma enhanced atomic layer deposition (PEALD) process, a metal organic chemical vapor deposition (MOCVD), or a molecular beam epitaxy (MBE) process. The coating may comprise an electrically-dissipative material. The electrically-dissipative material may provide a dissipative path from the coating to ground. The coating may be uniform, conformal, porosity free, have a thickness ranging from about 10 nm to about 900 nm, and an electrical surface/sheet resistance ranging from about $1\times10^5$ ohm/sq to about $1\times10^{11}$ ohm/sq.

In certain embodiments, the instant disclosure may be directed to an electrically-dissipative coating comprising an electrically-dissipative material. The coating may be uniform, conformal, porosity free, have a thickness ranging from about 10 nm to about 900 nm, and an electrical surface/sheet resistance ranging from about $1\times10^5$ ohm/sq to about $1\times10^{11}$ ohm/sq.

In certain embodiments, the instant disclosure may be directed to an end effector for a robot arm. The end effector may comprise an end effector body and a coating deposited on the surface of the end effector body. The coating may comprise an electrically-dissipative material. The electrically-dissipative material may provide a dissipative path from the coating to the ground. The coating may be uniform, conformal, and porosity free. The coating may have a thickness ranging from about 10 nm to about 900 nm. The coating may have an electrical surface/sheet resistance ranging from about $1\times10^5$ ohm/sq to about $1\times10^{11}$ ohm/sq.

In certain embodiments, the instant disclosure may be directed to a method. The method may comprise depositing a coating onto a surface of an end effector for a robot arm using an atomic layer deposition (ALD) process, a chemical vapor deposition (CVD) process, a plasma enhanced atomic layer deposition (PEALD) process, a metal organic chemical vapor deposition (MOCVD), or a molecular beam epitaxy (MBE) process. The coating may comprise an electrically-dissipative material. The electrically dissipative material may provide a dissipative path from the coating to the ground. The coating may be uniform, conformal, and porosity free. The coating may have a thickness ranging from about 10 nm to about 900 nm. The coating may have an electrical surface/sheet resistance ranging from about $1\times10^5$ ohm/sq to about $1\times10^{11}$ ohm/sq.

In certain embodiments, the instant disclosure may be directed to a substrate processing system. The substrate processing system may comprise a chamber, a robot disposed in the chamber, and a robot arm connected to the robot. The robot arm may comprise an end effector body, a replaceable contact pad, and a coating. The replaceable contact pad may be disposed on the end effector body. The replaceable contact pad may comprise a contact pad head having a contact surface configured to contact a substrate, and a shaft coupled to the contact pad head and received in an aperture formed in the body of the end effector and extending into a recess. The coating may be deposited on a surface of the end effector body and on the contact surface of the contact pad head. The coating may comprise an electrically-dissipative material. The electrically dissipative material may provide a dissipative path from the coating to the ground. The coating may be uniform and conformal.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
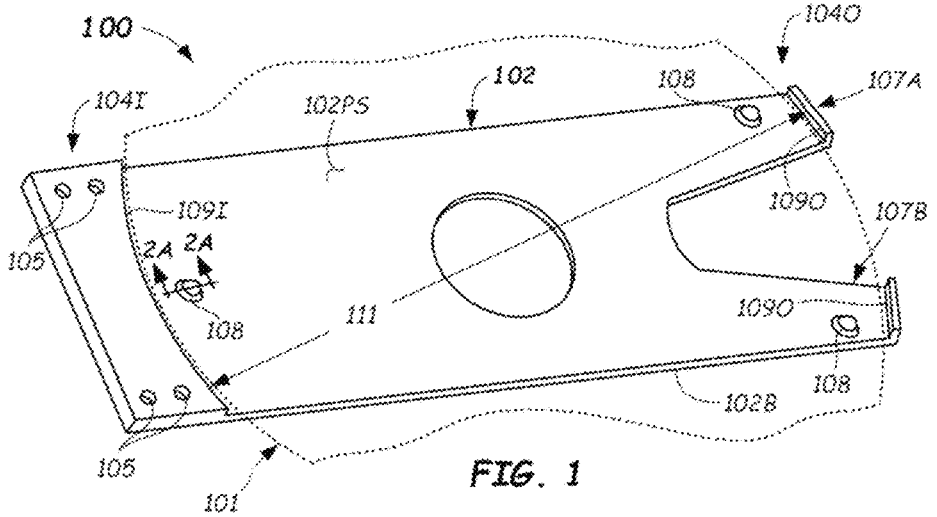
FIG. 1 illustrates a perspective view of an example of an end effector including one or more contact pads provided in accordance with an embodiment of the present disclosure.

In electronic device manufacturing processes, substrates (e.g., silicon wafers, silicon-containing plates, etc.) configured to produce electronic components (e.g., electronic chips or electronic subcomponents thereof) are moved, often via use of one or more robots, through a number of manufacturing steps. The robots include end effectors that support the substrates during such movements. Moving substrates very quickly can increase throughput and reduce manufacturing costs of the produced electronic components.

However, the rapid movement of robots when transporting substrates may also generate charged particles that can gather on surfaces and in turn contribute to substrate defects. Such substrate defects may be minimized by coating surfaces that tend to become charged (such as an end effector of a robot arm) with an electrically-dissipative coating. The electrically-dissipative coating may assist in releasing the charge from the surface, allowing the particles to break free of van der vaals forces and re-distribute. The electrically-dissipative coatings may be able to support electrostatic discharge and avoid arcing and other sudden conductive events between a charged chamber component surface (e.g., a charged end effector body) and/or wafer thereon and other system components.

The instant disclosure encompasses various embodiments relating to electrically-dissipative coatings, methods for depositing such electrically-dissipative coatings, chamber components coated with electrically-dissipative coatings, an end effector body coated with electrically-dissipative coatings, and a substrate processing system utilizing components (e.g., chamber components and/or substrate transport components (such as end effectors)) that are coated with such electrically-dissipative coatings. In some embodiments, the electrically-dissipative coatings are also plasma resistant coatings.

The coating processes described herein may be advantageous and cost effective as they may utilize bare chamber components (such as end effector bodies) that are more readily available, face less manufacturing and yield issues, have shorter lead times, and so on. Furthermore, a plurality of chamber components (such as end effector bodies) may be coated simultaneously (e.g., by inserting a plurality of end effector bodies into the ALD, CVD, PEALD, MOCVD, or MBE deposition chamber). The resulting coating may also be more uniform, more conformal, have lower porosity, be stronger, maintain its integrity longer (even under extreme conditions such as vacuum, thermal shock, thermal cycling, and so on), and have a narrower distribution of electrical surface/sheet resistivities, as compared to chamber components manufactured by other processes (such as bulk ceramic doping processes and slurry-based coating processes).

In an exemplary embodiment, the instant disclosure may be directed to a component for transporting substrates coated with a coating having certain properties. In one embodiment, the component for transporting substrates may be an end effector for a robot arm. The coating may have dissipative properties and may comprise an electrically-dissipative material to provide an electrically-dissipative path from the coating to the ground. The coating may be uniform, conformal, and porosity free. The coating may have a thickness ranging from about 10 nm to about 900 nm (e.g., about 20 nm to about 500 nm). The coating may have an electrical surface/sheet resistance ranging from about $1\times10^5$ ohm/sq to about $1\times10^{11}$ ohm/sq.

The body of the component for transporting substrates may comprise an insulator or a conductor, such as, without limitations, a ceramic, an electrically-conductive material (such as a metal), a polymer, quartz, and so on. In one embodiment, the body of the component for transporting substrates may comprise a material suitable for high temperature processes, such as quartz. Quartz may be suitable for high temperature processes due to its transparency, which permits radiation to go through it while having minimal thermal effect on the substrate that is being transported. The coating deposited on the component may retain some of the properties of the material of construction of the underlying component. For instance, the coating may retain the transparency of an underlying quartz component to maintain the minimal thermal effect on a substrate. In certain embodiments, the coating deposited on the component may have certain properties that are independent of the properties of the material of construction of the underlying component. For instance, the resistivity performance of the coating may be independent of the underlying component.

The coating may be a bilayer stack or a plurality of alternating layers stack. The coating may comprise a variety of materials and may be selected, among other factors, based on the target properties of the final coating (e.g., electrically-dissipative properties, transparency, thermal-conductivity, corrosion resistance, hardness, thermal shock resistance, thermal cycling resistance, vacuum resistance, scratch adhesion, wear rate, purity, roughness, conformality, and so on). In certain embodiments, the coating may comprise a stack of alternating layers of a first material-containing layer and a second material-containing layer. The thickness ratio of the thickness of each first material-containing layer to the thickness of each second material-containing layer may range from about 50:1 to about 1:50. In one embodiment, the bilayer stack or the alternating layer stack may include one or more of alumina and titania. The thickness ratio of the thickness of each alumina layer to the thickness of each titania layer may range from about 10:1 to about 1:10.

In certain embodiments, the component for transporting substrates that is being coated may be an end effector. The end effector body may comprise replaceable contact pads thereon for reducing and/or eliminating slipping of a substrate from the surface of the end effector during transport. In one embodiment, the replaceable contact pads may be coated along with the end effector with any of the coatings described herein using any of the coating methods described herein. Alternatively, or additionally, the replaceable contact pads may be composed of an electrically-dissipative material.

The coating described herein may be deposited via an atomic layer deposition (ALD) process, via a chemical vapor deposition (CVD) process, via an plasma enhanced atomic layer deposition (PEALD) process, via a metal organic chemical vapor deposition (MOCVD) process, via a molecular beam epitaxy (MBE) process, and other similar chemical precursor deposition processes. Coatings that comprise more than one layer and/or more than one metal may be deposited through sequential deposition, through co-deposition, or through co-dosing of precursors.

ALD (and optionally CVD, PEALD, MOCVD and/or MBE) may be suitable deposition methods in this disclosure due to their ability to uniformly and conformally coat components having complex three dimensional features, holes, large aspect ratios, and so on. Additionally with these coating processes, a plurality of bare components (e.g. end effectors) that have not been coated (e.g., bare bulk alumina that has not been doped with titania) may be placed in a deposition chamber and coated simultaneously. The cheaper starting material, the ability to coat a plurality of chamber components simultaneously, and the flexibility and ability to optimize the coating process, among other factors, provide for a more cost efficient process and ultimately a more affordable coated component.

As used herein, the singular forms "a," "an," and "the" include plural references unless the context clearly indicates otherwise. Thus, for example, reference to "a wafer" includes a single wafer as well as a mixture of two or more wafers; and reference to a "metal" includes a single metal as well as a mixture of two or more metals, and the like.

As used herein, the term "about" in connection with a measured quantity, refers to the normal variations in that measured quantity, as expected by one of ordinary skill in the art in making the measurement and exercising a level of care commensurate with the objective of measurement and the precision of the measuring equipment. In certain embodiments, the term "about" includes the recited number±10%, such that "about 10" would include from 9 to 11.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

As used herein, the term "plasma resistant" means resistant to one or more types of plasma as well as resistant to chemistry and radicals associated with the one or more types of plasma.

Certain embodiments are discussed herein with reference to an end effector that is coated with an electrically-dissipative coating. However, it should be understood that the electrically-dissipative coating described in embodiments herein may also be used to coat other components of processing chambers, transfer chambers, factory interface chambers, load locks, load ports, slit valves, and so on. Accordingly, the electrically-dissipative coatings described herein may coat any component of an electronic device processing tool or system. Some examples of such components include a substrate support assembly, an electrostatic chuck, a gas delivery plate, a lid, a nozzle, a liner, a ring (e.g., a process kit ring or single ring), a base, a showerhead, gas lines, a liner kit, a shield, a plasma screen, a flow equalizer, a cooling base, a chamber viewport, a chamber lid, and so on.

FIG. 1 depicts a first example embodiment of a chamber component that may be coated with the electrically-dissipative coating described herein. In FIG. 1, the exemplary chamber component is an end effector 100 configured to support a substrate 101 (a portion thereof shown dotted). The end effector 100 may be made up of an end effector body 102 having a top surface 102T (FIG. 2) and a bottom surface 102B. The top surface 102T may comprise a plane containing three spot faces that are raised above an underlying planar surface 102PS of the end effector body 102. The end effector body 102 may be configured to couple or interconnect to a robot component at an inboard end 1041, such as to a robot arm (e.g., robot wrist 653—see FIG. 6). Coupling may be by way of fasteners (not shown) received through bores 105 thus coupling the end effector 100 to the robot arm (e.g., wrist 653). Coupling may be made directly to the wrist member 653 or through and intermediate component such as a mounting plate 654 (FIG. 6) in order to reduce cracking of the end effector 100 when made from a ceramic or glass material.

An outboard end 1040 of the end effector body 102 can includes first fork 107A and second fork 107B, each of which can be configured to receive and support a contact pad 108 thereon. In some embodiments, the contact pads 108 are composed of an electrically-dissipative material or are coated with an electrically-dissipative material. The contact pads 108 on the outboard end 1040 and a third contact pad 108 proximate the inboard end 1041 can provide for stable three-point contact supporting the substrate 101 thereon (only a portion of substrate 101 shown in FIGS. 1 and 2). Substrate 101 can be supported on the contact pads 108 of the end effector 100 between an inboard shelf 1091, which may be an arcuate step of approximately a same radius as the substrate 101, and outboard shelves 1090. Spacing between the respective inboard shelves 1091 and outboard shelves 1090 can be slightly larger (e.g., a few mm) than the substrate 101, such as where dimension 111 may be a diameter that is slightly larger than 300 mm in diameter or 450 mm in diameter or other dimension of the substrate 101. Other configurations of the end effector body 102 other than shown can be used. The end effector 102 and/or contact pads 108 may be coated with an electrically-dissipative coating in embodiments.

Figure 2:
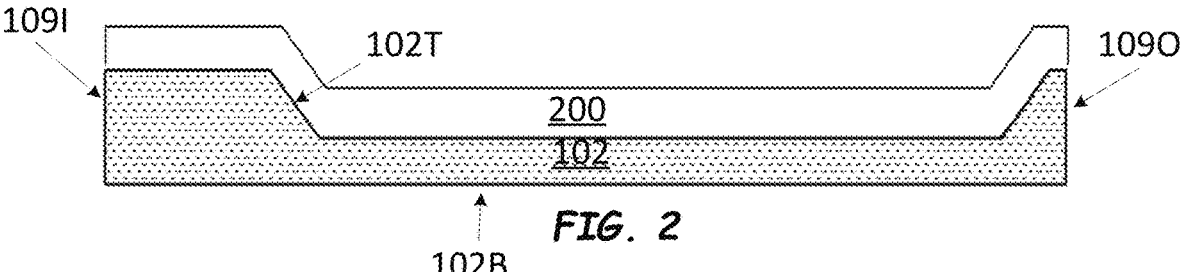
FIG. 2 depicts a side view of a coated end effector body in accordance with an embodiment of the present disclosure.

FIG. 2 is a side view of exemplary end effector body 102 depicting bottom surface 102B, top surface 102T, inboard shelf 1091, outboard shelf 1090, and a coating 200 deposited on top surface 102T. The dimensions of the end effector body 102 and coating 200 may be not to scale and are depicted in FIG. 2 for illustrative purposes only. Contact pads 108 are not depicted in FIG. 2. While the coating 200 is described herein as being deposited on the top surface (102T) of end effector body 102, coating 200 may also be deposited on the top surface of other chamber components even if not explicitly recited herein. Exemplary chamber components that may be coated with electrically-dissipative coating 200 may include transfer chambers, factory interface chambers, load locks, load ports, slit valves, and so on.

The end effector body 102 can be manufactured from a rigid material. In some embodiments, the end effector body 102 may be made of a stable, lightweight material that reduces the end effector's deflection under varying chamber processing conditions including pressure and temperature. Suitable, non-limiting, materials for the end effector body 102 include insulating material or conductive materials, such as, without limitations, a polymer, glass, quartz, ceramic, or a conductive material (such as a metal material).

For example, a ceramic such as bulk alumina can be used. In some embodiments, suitable ceramics may be semi-conductive to facilitate the discharge of any electrostatic charge that may build up on the substrate. Other semi-conductive ceramic materials include, for example, alumina-SiC composites, SiC, silicon nitride, boron nitride, and boron. In certain embodiments, the coating 200 disclosed herein contributes to the semi-conductive properties of a coated end effector body (or of any coated chamber component). The semi-conductive properties may avoid a high conductance that can result in arcing between the coated chamber component (e.g., end effector) and other system components. These semi-conductive properties may also be achieved via the coating 200 as described in further detail below.

Optionally, the end effector body 102 may comprise a conductive material such as a metal. Exemplary suitable conductive materials may include, without limitations, stainless steel, aluminum, nickel, copper, chromium, cobalt, molybdenum, ruthenium, tungsten, or platinum, for example. Other suitable metals or alloys (e.g., aluminum alloy A16061) can also be used. A conductive end effector body (or another conductive chamber component) may also be coated with a coating 200 to create a coated end effector body (or another coated chamber component) that has electrically-dissipative characteristics and may be able to support electrostatic discharge and avoid arcing and sudden conductive events between the end effector (or other chamber component) and/or wafer thereon and/or other system components.

The term "semi-conductive" herein is meant to include the bulk material of the particular component which exhibits semi-conductive electrical properties as well as conductive or non-conductive bulk material that is rendered semi-conductive by, for instance, a coating of semi-conductive material or other semi-conductive electrical paths such as wiring, layers, ribbons, lines, or other electrical channels disposed thereon or therethrough. Similarly, the term "conductive" herein is meant to include conductive bulk material or a semi-conductive or non-conductive material which is rendered conductive by a conductive coating or a conductive electrical path formed therethrough or thereon.

In some embodiments, the end effector 100 can be used at temperatures between 150° C. to 650° C. In high temperature thermal processes, there may be significant heat transfer between an end effector and a wafer in close proximity. The thermal shock associated with heat transfer from an alumina end effector to a wafer could potentially break a wafer. In contrast, use of a transparent end effector, such as an end effector comprising quartz, would not relay such a dramatic thermal shock. The mitigated thermal shock that is observed with quartz end effectors is believed to be due to quartz not being as thermally conductive as a ceramic (such as alumina) and due to quartz being transparent which would allow radiation to go through it (as compared to an opaque ceramic material such as alumina).

In certain embodiments, quartz may be used as the material of construction of end effectors used to transport substrates for high temperature thermal processes since quartz creates minimal thermal shadow (said differently, quartz has a minimal thermal effect on a wafer). Similarly, quartz may be used as the material of construction for other chamber components that would benefit from its minimal thermal effect. In such embodiments, the coating may be transparent to maintain the advantageous properties of a quartz end effector or of any other quartz chamber component.

In certain aspects it may be advantageous for the coating to maintain similar properties (e.g., transparency) to those of the material of construction of the underlying component. In other aspects it may be advantageous for the coating to be independent with respect to certain properties (e.g., resistivity performance) from those of the material of construction of the underlying component.

Rapid movement of robots when transporting substrates may generate particles. Static charge and the affinity for particles to gather on charged surfaces (e.g., on a charged surface of an end effector body coupled to a robot's arm) are believed to be one of the contributors to defects on substrates. It is believed that by coating a surface of an end effector body (or of another chamber component that exhibits a similar phenomenon) with an electrically-dissipative material, such as coating 200, the charge can be released from the surface of the end effector body (or of the other chamber component). This would allow the particles to break free of van der vaals forces and re-distribute. Said differently, the electrically dissipative material may provide a dissipative path from the coating to the ground. The ability to dissipate charge is believed to improve particle performance and defect performance on a substrate. Additionally, the coating 200 and/or pads 108 may provide an electrically-dissipative path between a supported wafer and ground. If a wafer supported by the end effector 102 has any residual charge, that charge may be discharged via a path through the pads 108 and/or the coating 200.

Coated end effector bodies (and other coated chamber components) may be manufactured with an electrically-dissipative material dopant to achieve the dissipation characteristics described above. However, manufacturing of doped components through bulk doping or slurry-based coating may be costly due to a variety of factors, such as, limited supply, manufacturing and yield issues, long lead time, and so on. Further, doped components may result in a brittle coating having a wide distribution of a range electrical surface/sheet resistivities across the coated surface. The instant disclosure achieves the above described dissipation characteristics by depositing a coating 200 on a top surface of an end effector body (or another chamber component) via an atomic layer deposition (ALD) process, via a chemical vapor deposition (CVD) process, via an plasma enhanced atomic layer deposition (PEALD) process, via a metal organic chemical vapor deposition (MOCVD) process, or via molecular beam epitaxy (MBE) process, some of which are described in further detail with respect to FIGS. 4 and 5. These processes may be advantageous and cost effective as bare chamber components (such as bare end effector bodies) are more readily available, face less manufacturing and yield issues, have shorter lead times, and so on. Furthermore, a plurality of chamber components (such as a plurality of end effector bodies) may be coated simultaneously (e.g., by inserting a plurality of end effector bodies into the ALD, CVD, PEALD, MOCVD, or MBE deposition chamber). The resulting coating may also be more uniform, more conformal, have lower porosity, be stronger, maintain its integrity longer, and have a narrower distribution of electrical surface/sheet resistivities across the coated surface, as compared to doped chamber components (such as end effectors) or chamber components (such as end effectors) coated by slurry-based coating processes.

Coating 200 may comprise an electrically-dissipative material. In certain embodiments, the coating 200 may also comprise a corrosion resistant material, which may be a plasma corrosion and/or erosion resistant material.

In some embodiments, the coating 200 may be a multilayer coating, where at least one of the layers in the multilayer coating is an electrically dissipative layer comprising one of the aforementioned electrically-dissipative materials, and wherein at least one other layer in the multilayer coating is a plasma resistant layer comprising a plasma resistant material.

In some embodiments, the coating 200 is a multilayer coating, and at least one layer in the multilayer coating may comprise at least one of aluminum oxide, yttrium oxide, zirconium oxide, $Y_3Al_5O_{12}$, a solid solution of $Y_2O_3$—$ZrO_2$, a compound comprising $Y_4Al_2O_9$ and a solid solution of $Y_2O_3$—$ZrO_2$, $HfO_2$, $HfAlO_x$, $HfZrO_x$, $HfYO_x$, Hf doped $Y_2O_3$, zinc oxide, tantalum oxide, titanium oxide, erbium oxide, gadolinium oxide, lanthanum oxide, praseodymium oxide, neodymium oxide, promethium oxide, samarium oxide, europium oxide, terbium oxide, dysprosium oxide, holmium oxide, thulium oxide, ytterbium oxide, or lutetium oxide.

In some embodiments, the coating 200 is a multilayer coating, and at least one layer in the multilayer coating may include $Y_2O_3$ and $Y_2O_3$ based ceramics, $Y_3Al_5O_{12}$ (YAG), $Al_2O_3$ (alumina), $Y_4Al_2O_9$(YAM), $YF_3$, SiC (silicon carbide), $ErAlO_3$, $GdAlO_3$, $NdAlO_3$, $YAlO_3$, $Si_3N_4$ (silicon nitride), AlN (aluminum nitride), $TiO_2$ (titania), $ZrO_2$ (zirconia), TiC (titanium carbide), ZrC (zirconium carbide), TiN (titanium nitride), $Y_2O_3$ stabilized $ZrO_2$ (YSZ), $Er_2O_3$ and $Er_2O_3$ based ceramics, $Gd_2O_3$ and $Gd_2O_3$ based ceramics, $Er_3Al_5O_{12}$ (EAG), $Gd_3Al_5O_{12}$ (GAG), $Nd_2O_3$ and $Nd_2O_3$ based ceramics, a ceramic compound comprising $Y_4Al_2O_9$ and a solid-solution of $Y_2O_3$—$ZrO_2$, a ceramic compound comprising $Y_2O_3$, $Er_2O_3$, $ZrO_2$, $Gd_2O_3$ and $SiO_2$, Hf based oxides and solid solutions, lanthanide based oxides and solid solutions, or a combination of any of the above.

In some embodiments, the coating 200 is a multilayer coating, and at least one layer in the multilayer coating comprises a solid solution formed by any of the aforementioned ceramics. The coating 200 may also include a layer that may be a multiphase material that includes a solid solution of one or more of the aforementioned materials and one or more additional phase.

With reference to the solid-solution of $Y_2O_3$—$ZrO_2$, a layer of the coating 200 may include $Y_2O_3$ at a concentration of 10-90 molar ratio (mol %) and $ZrO_2$ at a concentration of 10-90 mol %. In some examples, the solid-solution of $Y_2O_3$—$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol %

$ZrO_2$, may include 60-70 mol % $Y_2O_3$ and 30-40 mol % $ZrO_2$, may include 70-80 mol % $Y_2O_3$ and 20-30 mol % $ZrO_2$, may include 80-90 mol % $Y_2O_3$ and 10-20 mol % $ZrO_2$, and so on.

With reference to a layer of the coating 200 comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the coating 200 can include $Y_2O_3$ in a range of 40-100 mol %, $ZrO_2$ in a range of 0.1-60 mol % and $Al_2O_3$ in a range of 0.1-10 mol %. In another embodiment, a layer of the coating 200 can include $Y_2O_3$ in a range of 40-60 mol %, $ZrO_2$ in a range of 35-50 mol % and $Al_2O_3$ in a range of 10-20 mol %. In another embodiment, a layer of the coating 200 can include $Y_2O_3$ in a range of 40-50 mol %, $ZrO_2$ in a range of 20-40 mol % and $Al_2O_3$ in a range of 20-40 mol %. In another embodiment, a layer of the coating 200 can include $Y_2O_3$ in a range of 80-90 mol %, $ZrO_2$ in a range of 0.1-20 mol % and $Al_2O_3$ in a range of 10-20 mol %. In another embodiment, a layer of the coating 200 can include $Y_2O_3$ in a range of 60-80 mol %, $ZrO_2$ in a range of 0.1-10 mol % and $Al_2O_3$ in a range of 20-40 mol %. In another embodiment, a layer of the coating 200 can include $Y_2O_3$ in a range of 40-60 mol %, $ZrO_2$ in a range of 0.1-20 mol % and $Al_2O_3$ in a range of 30-40 mol %. In other embodiments, other distributions may also be used for one or more layers of the coating 200.

In one embodiment, the coating 200 is a multilayer coating, and at least one layer includes or consists of a ceramic compound that includes a combination of $Y_2O_3$, $ZrO_2$, $Er_2O_3$, $Gd_2O_3$ and $SiO_2$. In one embodiment, a layer of the coating 200 can include $Y_2O_3$ in a range of 40-45 mol %, $ZrO_2$ in a range of 0-10 mol %, Er2O3 in a range of 35-40 mol %, $Gd_2O_3$ in a range of 5-10 mol % and SiO2 in a range of 5-15 mol %. In a first example, a layer of the coating 200 includes 40 mol % $Y_2O_3$, 5 mol % $ZrO_2$, 35 mol % $Er_2O_3$, 5 mol % $Gd_2O_3$ and 15 mol % $SiO_2$. In a second example, a layer of the coating 200 includes 45 mol % $Y_2O_3$, 5 mol % $ZrO_2$, 35 mol % $Er_2O_3$, 10 mol % $Gd_2O_3$ and 5 mol % $SiO_2$. In a third example, a layer of the coating 200 includes 40 mol % $Y_2O_3$, 5 mol % $ZrO_2$, 40 mol % $Er_2O_3$, 7 mol % $Gd_2O_3$ and 8 mol % $SiO_2$.

Any of the aforementioned coating materials may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

In some embodiments, the coating 200 may comprise an alternating stack of a first material-containing layer and a second material containing layer, as discussed above. The first material-containing layer may comprise a single metal or metal alloy. Exemplary metal or metal alloys that may be used for the first material-containing layer may include those whose oxide is typically used as ceramic in bulk. In some embodiments, the first material-containing layer may comprise one or more of Al, Zr, Y—Zr, Mg—Al, Ca—Al, or Si. The second material-containing layer may be a resistivity modifier such as, without limitations, one or more of a transition metal, rare earth, main group metal, semiconductor, or an alloy thereof. In some embodiments, the second material-containing layer may comprise one or more of Ti, Fe, Co, Cu, Ni, Mn, V, Y, Nb, In, Sn, Fe—Co, or La—Ta.

In some embodiments, the first material-containing layer and the second-material containing layer may independently be an oxide, hydroxide, nitride, carbide, or metallic (i.e., have little to no oxygen or hydrogen or nitrogen or carbon). In one embodiment, the first material-containing layer and the second material-containing layer may both be in an oxide, hydroxide, nitride, carbide, or metallic form. In another embodiment, the first material-containing layer may have a different form from the second material-containing layer. For example, the first material-containing layer may comprise aluminum hydroxide (e.g., $Al_2O_{2.99}H_{0.01}$) and the second material-containing layer may be metallic Ti, TiN, SiC, metallic Al, and so on.

In some embodiments, the first material-containing layer may have a first target thickness and the second material-containing layer may have a second target thickness. The ratio of the first target thickness to the second target thickness may range from about 50:1 to about 1:50, from about 30:1 to about 1:30, from about 20:1 to about 1:20, from about 10:1 to about 1:10, from about 10:1 to about 1:1, from about 8:1 to about 1:1, from about 5:1 to about 1:1, from about 10:1 to about 2:1, from about 8:1 to about 2:1, from about 5:1 to about 2:1, or from about 5:2 to about 1:1.

In one embodiment, the coating 200 may be alumina. In one embodiment, the coating 200 may be titania. In one embodiment, the coating 200 may be a combination of alumina and titania, for example, an alternating stack of alumina and titania. In one embodiment, the electrically-dissipative material is a stack of alternating layers of alumina and titania and the ratio of a thickness of each alumina layer to a thickness of each titania layer in the stack ranges from about 10:1 to about 1:10. For example, the ratio of thickness may be from about 8:1 to about 1:1, from about 5:1 to about 1:1, from about 10:1 to about 2:1, from about 8:1 to about 2:1, from about 5:1 to about 2:1, or from about 5:2 to about 1:1. In one embodiment, the electrically dissipative material may be a stack of alumina and metallic titanium, or a stack of aluminum hydroxide and metallic titanium, and so on.

Figures 7A, 7B:
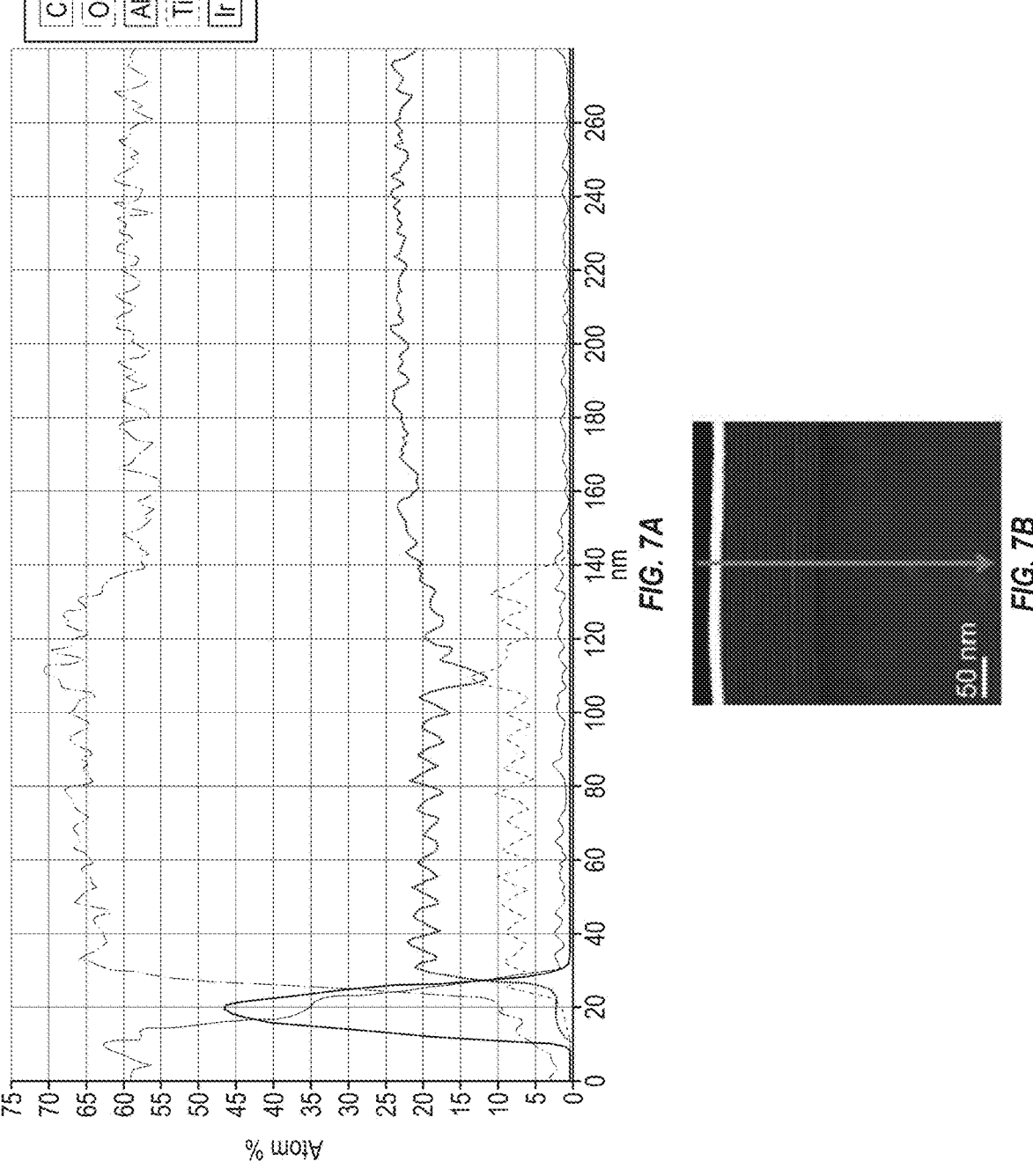
FIG. 7A depicts an EDS line scan of a coating according to an embodiment of the present disclosure.
FIG. 7B depicts a TEM image at 50 nm scale of the coating depicted in FIG. 7A.

For instance, FIG. 7A depicts an Energy Dispersive X-Ray Spectroscopy (EDS) line scan of a coating comprising a stack of alternating layers of alumina and titania and FIG. 7B depicts a Transmission Electron Microscopy (TEM) image at 50 nm scale of the coating depicted in FIG. 7A. In FIG. 7A, the atom % of oxygen is depicted by graphical representation 730, the atom % of aluminum is depicted by graphical representation 720, and the atom % of titanium is depicted by graphical representation 710. FIG. 7A illustrates that the electrically-dissipative coating comprises well separated alternating stacks of alumina and titania layers evidenced, in part, by wavy graphical representations 710 and 720 in the 30 nm to 130 nm range. The electrically-dissipative coating depicted in FIGS. 7A and 7B comprise well-separated layers with each alumina ($AlO_x$) layer having a thickness of about 5 nm and each titania ($TiO_y$) layer having a thickness of about 2 nm. The ratio of the thickness of each alumina layer to the thickness of each titania layer may be evidenced by the atomic percentage of aluminum compared to the atomic percentage of titanium in the EDS line scan of FIG. 7A. The total electrically-dissipative coating has a thickness of about 100 nm. The electrically dissipative coating was deposited on a bulk alumina surface as evidenced in the EDS line scan of FIG. 7A in the 140 nm to 280 nm range.

The coating 200 may be crystalline or amorphous and may uniformly and conformally cover the chamber component (e.g., end effector body) and any features thereon (such as contact pads 102) with a substantially uniform thickness. In one embodiment, the coating 200 has a conformal coverage of the underlying surface that is coated (including coated surface features) with a uniform thickness having a thickness variation of less than about +/−20%, a thickness variation of less than about +/−10%, a thickness variation of less than about +/−5%, or a lower thickness variation when comparing the thickness of the coating at one location to the thickness of the coating at another different location (or when assessing the standard deviation arising from a plurality of thicknesses assessed at a plurality of locations). The TEM image in FIG. 7B of an electrically dissipative coating according to an embodiment illustrates the uniform thickness of the coating across the entire depicted surface.

The coating 200 may also have a substantially uniform electrical surface/sheet resistivity or, in other words, a narrow distribution of electrical surface/sheet resistivities across the surface of the coating. In some embodiments, the coating 200 has a uniform electrical surface/sheet resistivity with an electrical surface/sheet resistivity variation of less than about +/−35%, less than about +/−30%, less than about +/−25%, less than about +/−20%, an electrical surface/sheet resistivity variation of less than about +/−10%, an electrical surface/sheet resistivity variation of less than about +/−5%, or a lower electrical surface/sheet resistivity variation when comparing the electrical surface/sheet resistivity of the coating at one location to the electrical surface/sheet resistivity of the coating at another different location (or when assessing the standard deviation arising from a plurality of surface/sheet resistivities assessed at a plurality of locations).

Figures 9A, 9B, 10A, 10B:
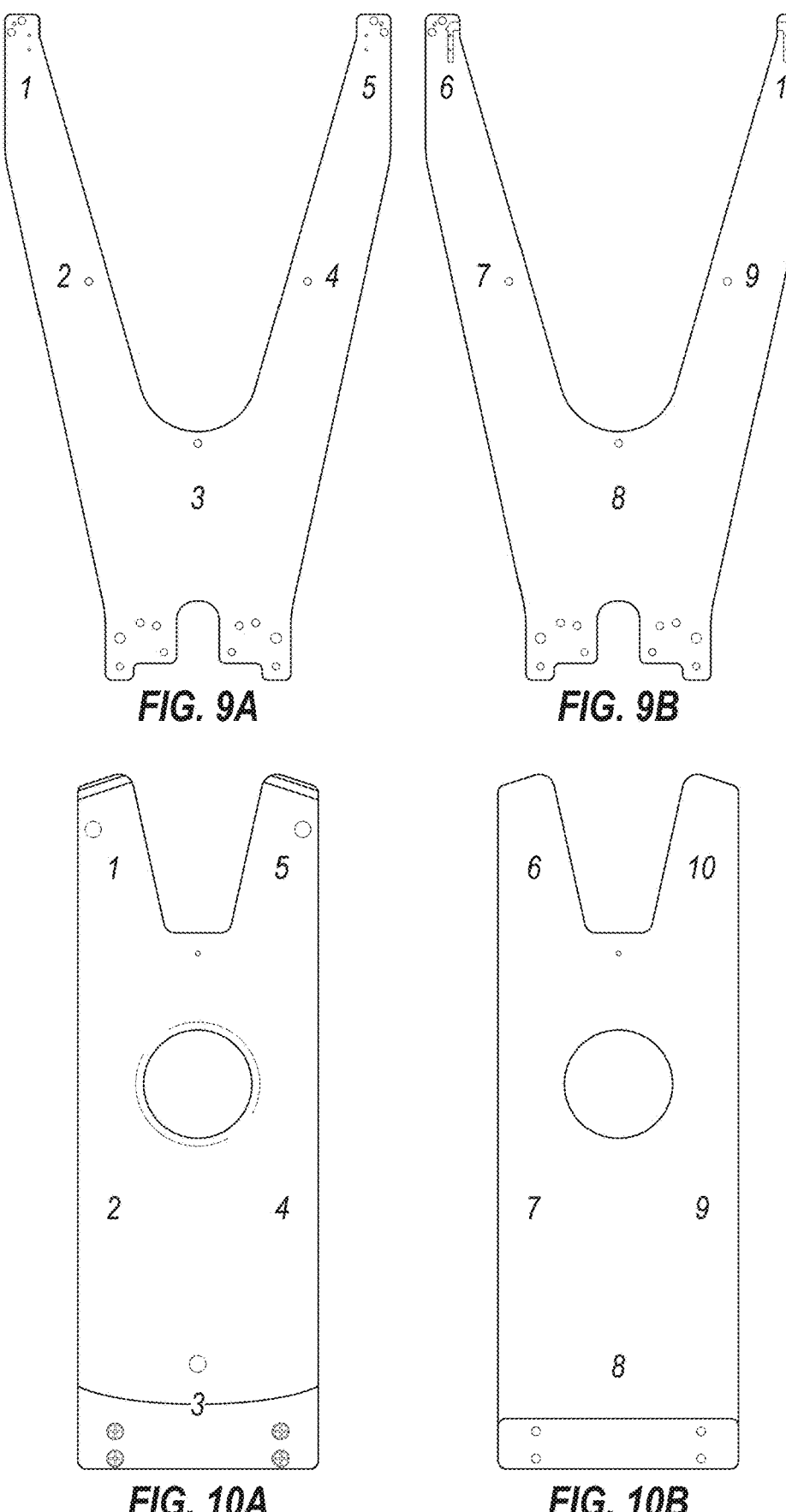
FIGS. 9A and 9B depict images of the front and back, respectively, of an exemplary end effector coated with a coating according to an embodiment. The sheet resistance values measured in each of the locations identified are summarized in Table 1.
FIGS. 10A and 10B depicts images of the front and back, respectively, of an exemplary bulk-doped ceramic end effector. The sheet resistance values measured in each of the locations identified are summarized in Table 2.

For example, FIGS. 9A and 9B depict images of the front and back, respectively, of an exemplary end effector coated with a coating according to an embodiment. The sheet resistance values measured in each of the locations identified are summarized in Table 1 below.

TABLE 1

| Sheet Resistance Distribution Across Front and Back Surfaces of an Exemplary End Effector Coated with a Coating According to an Embodiment | |
| --- | --- |
| Location | Sheet Resistance (Ohm/square) |
| 1 | 2.90E+06 |
| 2 | 3.60E+06 |
| 3 | 1.50E+06 |
| 4 | 2.20E+06 |
| 5 | 2.80E+06 |
| 6 | 2.60E+06 |
| 7 | 2.50E+06 |
| 8 | 3.40E+06 |
| 9 | 4.20E+06 |
| 10 | 2.90E+06 |
| Average | 2.86E+06 |
| Standard Deviation | 25% |

In comparison, FIGS. 10A and 10B depicts images of the front and back, respectively, of an exemplary bulk-doped ceramic end effector. The sheet resistance values measured in each of the locations identified are summarized in Table 2 below.

TABLE 2

| Sheet Resistance Distribution Across Front and Back Surfaces of an Exemplary Bulk-Doped Ceramic End Effector | |
| --- | --- |
| Location | Sheet Resistance (Ohm/square) |
| 1 | 2.60E+11 |
| 2 | 4.00E+07 |
| 3 | 2.20E+10 |
| 4 | 7.00E+10 |

TABLE 2-continued

Sheet Resistance Distribution Across Front and Back Surfaces
of an Exemplary Bulk-Doped Ceramic End Effector

| Location | Sheet Resistance (Ohm/square) |
|---|---|
| 5 | 2.00E+11 |
| 6 | 5.00E+07 |
| 7 | 1.80E+07 |
| 8 | 8.70E+11 |
| 9 | 1.40E+07 |
| 10 | 3.30E+07 |
| Average | 3.25E+10 |
| Standard Deviation | 6E10% |

The standard deviation in Table 1 and Table 2 is an indicator of the uniformity in sheet resistance values across various locations on an end effector. The standard deviation in Table 2 illustrated significant non-uniformity of the sheet resistance on the surface of bulk doped ceramic end effector. In comparison, coating an end effector in accordance with embodiments described herein illustrated improved sheet resistance uniformity on the surface of the end effector. This may be evidenced by the smaller standard deviation in Table 1 and the narrower distribution of electrical surface/sheet resistivities across the coated surface.

Since the deposition processes described herein (ALD, CVD, PEALD, MOCVD, MBE) are very conformal processes, the coating 200 may have a roughness that matches the roughness of the underlying surface that is coated. In certain embodiments, the coating 200 may have a surface roughness that is about +/–20% or less, about +/–10% or less, or about +1-5% or less, as compared to the surface roughness of the underlying surface that is being coated. The coating described herein may be advantageous for components that have high aspect ratios (e.g., aspect ratios of about 3:1 to about 300:1, 20:1, 50:1, 100:1, 150:1, and so on), complex geometric shapes, and three dimensional structures, as it uniformly and conformally coats the component's surface in its entirety including all complex features thereon.

For instance, a surface micrograph (not shown) of a sample coated with a 50 nm thick alumina-titania nanolaminate having a 5 nm:2 nm ratio of each alumina layer thickness to each titania layer thickness and an electrical surface/sheet resistance of about $1.6 \times 10^7$ (per ASTM D-257 method), according to an embodiment, illustrated that the coating is conformal, thin, crack-free, and follows the surface roughness of the underlying alumina substrate.

This was further supported by top view Scanning Electron Microscope (SEM) images (not shown) of an undoped, bare alumina substrate and a nanolaminate coated alumina substrate. The roughness of the undoped, bare alumina substrate was measured at 51±13 micro-inches. The roughness of the nanolaminate coated alumina substrate was measured at 49±6 micro-inches. The roughness measurements and the two SEM images showed that the coating, according to embodiments described herein, at a 200 nm thickness, retained the underlying substrate's features and roughness. This data indicated that the mechanical properties of the underlying substrate and feature shapes, on a sub-micron scale, were retained by the thin and conformal coatings described herein.

The coating 200 may be very dense and have a very low porosity as compared to other deposition techniques (such as e-beam IAD or plasma spray). For instance, the coating 200 may have a porosity of less than about 1.5%, less than about 1%, less than about 0.5%, or about 0% (i.e., porosity free). The term "porosity-free" as used herein means absence of any pores, pin-holes, voids, or cracks along the whole depth of the coating 200 as measured by transmission electron microscopy (TEM). In contrast, with conventional e-beam IAD or plasma spray techniques or doping or slurry-based coating, where the porosity may be 1-5% and in some instances even higher. The TEM image in FIG. 7B of an electrically dissipative coating according to an embodiment illustrates the high density and low porosity properties of the coating.

End effector body 102 (or other chamber components) may be coated with a coating 200 comprising a corrosion resistant material to withstand processing in corrosive plasmas. Non-limiting examples of corrosive processing gases include halogen-containing gases, such as $C_2F_6$, $SF_6$, $SiCl_4$, HBr, $NF_3$, $CF_4$, $CHF_3$, $CH_2F_3$, F, $Cl_2$, $CCl_4$, $BCl_3$ and $SiF_4$, among others, and other gases such as $O_2$, or $N_2O$.

The resistance of the coating 200 to plasma may be measured through "etch rate" (ER), which may have units of Angstrom/min (Å/min), throughout the duration of the coated components' operation and exposure to plasma. Plasma resistance may also be measured through an erosion rate having the units of nanometer/radio frequency hour (nm/RFHr), where one RFHr represents one hour of processing in plasma processing conditions. Measurements may be taken after different processing times. For example, measurements may be taken before processing, after 50 processing hours, after 150 processing hours, after 200 processing hours, and so on. An erosion rate lower than about 100 nm/RFHr, in halogen plasma, is typical for a coating that is corrosion resistant. Variations in the composition of the coating 200 deposited on the end effector body (or other chamber component) may result in multiple different plasma resistances or erosion rate values. Additionally, a coating 200 that is corrosion resistant with one composition exposed to various plasmas could have multiple different plasma resistances or erosion rate values. For example, a coating 200 may have a first plasma resistance or erosion rate associated with a first type of plasma and a second plasma resistance or erosion rate associated with a second type of plasma.

The electrical surface/sheet resistance of the coating 200 may range from about $1 \times 10^4$ ohm/sq. to about $1 \times 10^{12}$ ohm/sq., from about $1 \times 10^4$ ohm/sq. to about $1 \times 10^{11}$ ohm/sq., from about $1 \times 10^5$ ohm/sq. to about $1 \times 10^{11}$ ohm/sq., from about $1 \times 10^4$ ohm/sq. to about $1 \times 10^{10}$ ohm/sq., from about $1 \times 10^4$ ohm/sq. to about $1 \times 10^9$ ohm/sq., from about $1 \times 10^4$ ohm/sq. to about $1 \times 10^8$ ohm/sq., from about $1 \times 10^4$ ohm/sq. to about $1 \times 10^7$ ohm/sq., from about $1 \times 10^4$ ohm/sq. to about $1 \times 10^6$ ohm/sq., from about $1 \times 10^4$ ohm/sq. to about $1 \times 10^5$ ohm/sq., from about $1 \times 10^5$ ohm/sq. to about $1 \times 10^{10}$ ohm/sq., rom about $1 \times 10^5$ ohm/sq. to about $1 \times 10^9$ ohm/sq., rom about $1 \times 10^5$ ohm/sq. to about $1 \times 10^8$ ohm/sq., from about $1 \times 10^5$ ohm/sq. to about $1 \times 10^7$ ohm/sq., from about $1 \times 10^5$ ohm/sq. to about $1 \times 10^6$ ohm/sq., from about $1 \times 10^6$ ohm/sq. to about $1 \times 10^{11}$ ohm/sq., from about $1 \times 10^6$ ohm/sq. to about $1 \times 10^{10}$ ohm/sq., from about $1 \times 10^6$ ohm/sq. to about $1 \times 10^9$ ohm/sq., from about $1 \times 10^6$ ohm/sq. to about $1 \times 10^8$ ohm/sq., from about $1 \times 10^6$ ohm/sq. to about $1 \times 10^7$ ohm/sq., from about $1 \times 10^7$ ohm/sq. to about $1 \times 10^{11}$ ohm/sq., from about $1 \times 10^7$ ohm/sq. to about $1 \times 10^{10}$ ohm/sq., from about $1 \times 10^7$ ohm/sq. to about $1 \times 10^9$ ohm/sq., from about $1 \times 10^7$ ohm/sq. to about $1 \times 10^8$ ohm/sq., from about $1 \times 10^{10}$ ohm/sq. to about $1 \times 10^{12}$ ohm/sq., from about $1 \times 10^{10}$ ohm/sq. to about $1 \times 10^{11}$ ohm/sq., or any other electrical surface/sheet resistance in between these ranges, measured using surface/sheet resistance measurement system (such as, Prostat PRS-801 with Probe PRF-912) pursuant to method ASTM D-257.

In certain embodiments, the electrical surface/sheet resistance of the coating 200 may remain unchanged after being subjected to thermal cycling at a temperature ranging from about 150° C. to about 800° C., from about 200° C. to about 750° C., from about 300° C. to about 700° C., from about 400° C. to about 600° C., or at about 500° C. In certain embodiments, the coating 200 may have electrical surface/sheet resistance after thermal cycling that is within about +/−35%, within about +/−30%, within about +/−25%, within about +/−20%, within about +/−10%, or within about +1-5%, as compared to the electrical surface/sheet resistance of the coating 200 prior to thermal cycling.

In an embodiment where coating 200 comprises a 100 nm thick alumina and titania nanolaminate coating on silicon (where the ratio of the thickness of each alumina layer to the thickness of each titania layer is about 5:2 and the coating was deposited using ALD at 200° C.), the electrical surface/sheet resistance of the as deposited coating was about $9.53 \times 10^6$ ohm/sq. After subjecting said coating to thermal cycling, the resistance of the coating was about $3.90 \times 10^6$ ohm/sq. Thermal cycling was conducted by subjecting the coating to 400° C. in air five times for a duration of one hour each time. Specifically, the thermal cycling profile that said coating was subjected to was: a) temperature increase at a rate of 10° C./min from 30° C. to about 400° C., b) coating held at 400° C. for a duration of about 1 hour, c) temperature reduction to 60° C., d) cycles a) to c) were repeated four more times, e) final temperature reduction to 30° C.

Coating 200 may be resistant to thermal shock. The resistance to thermal shock may be evaluated by comparing the amount of cracks and electrical surface/sheet resistance of an as-deposited coating to the amount of cracks and electrical surface/sheet resistance of a coating that has been subjected to thermal shock. A coating may be subjected to thermal shock by exposing it for about 10 minutes at 200° C. on a hot plate and thereafter dunking the heated coating into ice-water followed by air drying. A coating that is resistant to thermal shock may have an electrical surface/sheet resistance after thermal shock that is within about +/−35%, within about +/−30%, within about +/−25%, within about +/−20%, within about +/−10%, or within about +1-5%, of the electrical surface/sheet resistance of the coating prior to thermal shock. A coating that is resistant to thermal shock may be one that has no cracks prior to thermal shock and also has no cracks after having been subjected to thermal shock.

For example, a nano-laminate coating of 5 nm:3 nm AlO:TiO (i.e., a ratio of each alumina layer thickness to each titania layer thickness being 5:3) having a thickness of 100 nm was deposited on a quartz coupon without any intermediate buffer layer between the quartz coupon and the coating. The sheet resistance of this exemplary coating, as deposited, was 5.7 (±1.2)×E6 ohm/square. After subjecting the coated coupon to a 200° C. shock test, the sheet resistance of the coating was 7.3 (±1)×E6 ohm/square. This data illustrated that the resistivity performance of the exemplified coating was independent of that of the underlying component (or substrate, which in this example was the quartz coupon). This data also illustrated that the coating maintained an electrical surface/sheet resistance after thermal shock that is at least within about +/−35% of the electrical surface/sheet resistance of the coating prior to thermal shock.

In an embodiment where coating 200 comprises a 50 nm thick alumina and titania nanolaminate coating (where the ratio of the thickness of each alumina layer to the thickness of each titania layer is about 5:2), the electrical sheet-resistance of the as deposited coating was about $1.6 \times 10^7$ ohm/sq. After subjecting said coating to thermal treatment at 200° C., the resistance of the coating was about $1.90 \times 10^8$ ohm/sq, measured according to ASTM D-257 method.

Figure 8:
FIG. 8 depicts the electrical surface/sheet resistance of a coating according to an embodiment as a function of pressure.

Coating 200 may be resistant to vacuum. The resistance to vacuum may be evaluated by comparing the electrical sheet resistance of coating 200 outside of vacuum and in vacuum. A coating that is resistant to vacuum may have an electrical sheet resistance in vacuum that is within about +/−35%, within about +/−30%, within about +/−25%, within about +/−20%, within about +/−10%, or within about +1-5%, of the electrical sheet resistance of the coating prior out of vacuum. In an embodiment where coating 200 comprises an alumina and titania nanolaminate coating (where the ratio of the thickness of each alumina layer to the thickness of each titania layer is about 5:2 and the coating was deposited at 200° C.), the electrical sheet-resistance of the coating in vacuum at 298 K (or at 500K) is within about +/−20% of the electrical sheet resistance of the coating outside vacuum at 298 K (or at 500K), as seen in FIG. 8.

Coating 200 may have a Vickers hardness ranging from about 500 kg/mm² to about 1000 kg/mm², from about 600 kg/mm² to about 900 kg/mm², or from about 700 kg/mm² to about 800 kg/mm². Coating 200 may have an indentation modulus ranging from about 100 GPa to about 300 GPa, from about 120 GPa to about 250 GPa, or from about 150 GPa to about 200 GPa.

In an embodiment where coating 200 comprises an alumina and titania nanolaminate coating on silicon (where the ratio of the thickness of each alumina layer to the thickness of each titania layer is 5:2 and the coating was deposited at 200° C.), the Vickers hardness value is about 791.88±50.55 kg/mm² and the indentation modulus is about 168.74±7.42 GPa. The hardness and indentation modulus may be measured using a nano hardness tester at a temperature of about 21-23° C., using a maximum force of about 0.5 mN, 1.0 mN, 2.0 mN, and 5.0 mN, a loading time of about 15 seconds, an unloading time of about 15 seconds, a pause time of about 10 seconds, with a Poisson's ratio of about 0.2, and an indenter ID Berkovich Diamond.

In comparison, the Vickers hardness value of a 100 nm alumina deposited by ALD at 120° C. is about 510 kg/mm² and the Vickers hardness value of a 100 nm titania deposited by ALD at 120° C. is about 127 kg/mm². For α-alumina mineral, the Vickers hardness is about 1365 kg/mm² and elastic modulus is about 370 GPa. For anatase titania mineral the Vickers hardness is about 980 kg/mm² and the elastic modulus is about 230-290 GPa.

Coating 200 may have composition purity of about 90% to about 100%, about 95% to about 99.9%, about 97% to about 99.8%, about 99% to about 99.7%, or about 99.5%, measured by X-ray photoelectron spectroscopy.

Suitable thickness for the coating 200 may range from about 1 nm to 1000 nm. In embodiments, the coating may have a maximum thickness of about 750 nm, a maximum thickness of about 500 nm, a maximum thickness of about 400 nm, a maximum thickness of about 300 nm, a maximum thickness of about 250 nm, a maximum thickness of about 200 nm, a maximum thickness of about 150 nm, a maximum thickness of about 100 nm, a maximum thickness of 50 nm, a maximum thickness of 30 nm, a maximum thickness of 20 nm, or another maximum thickness. In embodiments, the coating 200 may have a minimum thickness of 5 nm, a minimum thickness of 10 nm, a minimum thickness of 20 nm, a minimum thickness of 25 nm, a minimum thickness of 35 nm, a minimum thickness of 50 nm, a minimum thickness of 100 nm, a minimum thickness of 150 nm, or another minimum thickness.

Referring back to FIG. 1, the end effector 100 may include three contact pads 108. However, other embodiments may include other numbers of the contact pads 108. Contact pads 108 may be included on the end effector body to minimize substrate sliding on the end effector body during transport. To reduce sliding of the substrates, certain end effectors comprise integrally-machined contact pads. The integrally-machined contact pads may have domed contact surfaces with surface characteristics that contact and support the substrates and that also provide a low propensity for sliding. Each integrally-machined contact pad may have a machined contact surface with a particular domed profile and surface roughness, which may reduce the likelihood of a substrate sliding thereon. In some instances, wear of the integrally-machined end effector contact pads and contamination thereof with silicon particles/dust can increase the propensity of the substrates to slide on the contact pads and thus can limit the useful life of the end effector. To prevent substrate sliding, the entire end effector may be replaced periodically. In some embodiments, coating 200 covers the contact pads 180. In some embodiments, the contact pads 180 are composed of an electrically-dissipative material.

In certain embodiments of the present disclosure, replaceable contact pads are provided that can be rapidly changed out and replaced when worn. Thus, the overall cost of continuing to provide a low slide end effector may be dramatically reduced. An exemplary replaceable contact pad that may be disposed in end effector body 102 is shown in FIG. 3.

Figure 3:
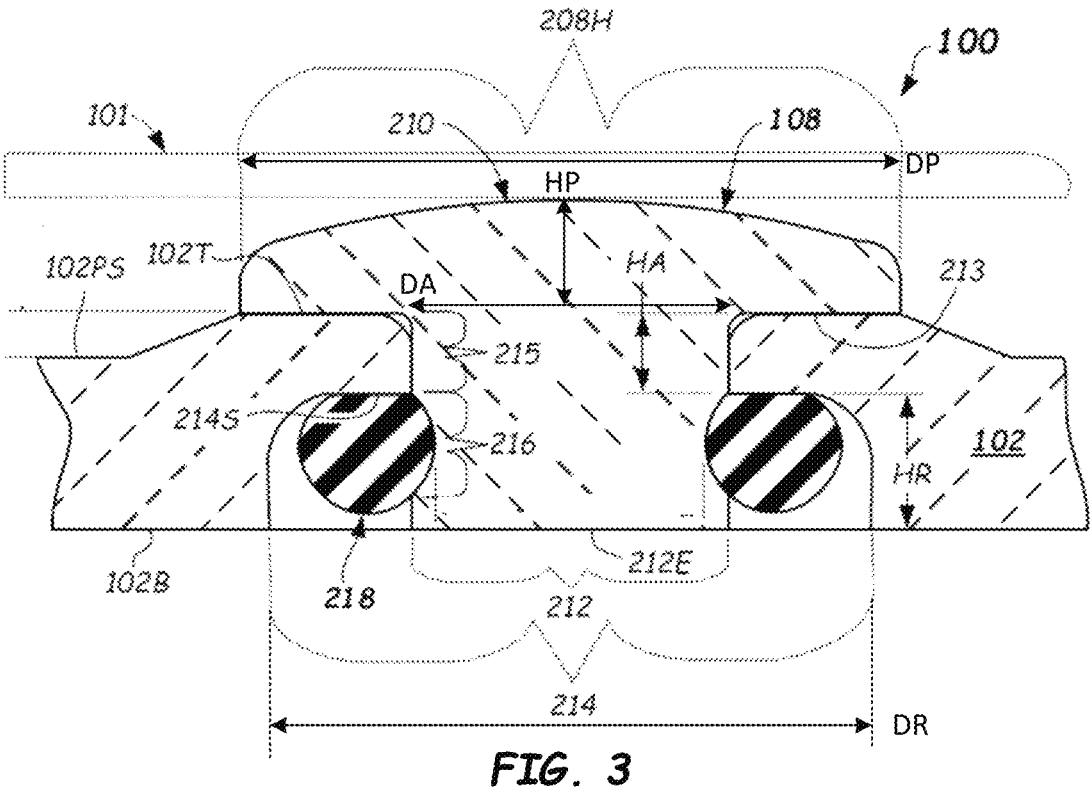
FIG. 3 illustrates a partial cross-sectional view taken along section 2A-2A of FIG. 1 of a portion of an end effector including a replaceable contact pad in accordance with embodiments of the present disclosure.

As depicted in FIG. 3, the bottom surface 102B of the end effector body 102 may include a recess 214 formed therein. The recess 214 can be circular, and can extend into the end effector body 102 from the bottom surface 102B to a depth HR. An aperture 215 may be formed in the end effector body 102 and may extend between the top surface 102T and the recess 214. The recess 214 can have a recess diameter DR of from about 5 mm to about 10 mm, and a recess height HR of from about 1.1 mm to about 2.0 mm, for example. The aperture 215 can have an aperture DA diameter of from about 2.8 mm to about 4.8 mm, and an aperture height HA of from about 0.85 mm to about 1.1 mm, for example. Other diameters and heights and depths can be used. Each may be larger for use with substrates of 450 mm in diameter.

The contact pad 108 may include a contact pad head 208H having a contact surface 210 that may be configured to contact the substrate 101. The contact surface 210 can include a domed shape. The contact surface 210 can have a surface roughness of from about 45 pin Ra to about 65 pin Ra measured using a profilometer (such as Surfcorder SE-2300 equipment complying to JIS standards). The contact pad head 208H can have a contact pad height HP of from about 1.0 mm to about 2.0 mm, for example. The contact pad head 208H can have a contact pad diameter DP of from 6.0 mm to 12.0 mm, for example. Other suitable contact surface dimensions, profiles, radiuses, and surface roughness can be used.

The contact pad 108 may further include a shaft 212 coupled to the contact pad head 208H and the shaft 212 may be received in aperture 215. Contact pad head 208H and the shaft 212 may be integrally formed as a one-piece component. The shaft 212 can further extend a distance from the underside 213 of the contact pad head 208H into the recess 214. The shaft 212 may include a shaft indent 216 formed therein. The shaft 212 should not extend below the bottom surface 102B of the end effector body 102 so as not to interfere with substrate placement. The shaft indent 216 may be provided in a form of a groove and may be formed in shaft 212 at a location between the underside 213 of the contact pad head 208H and the shaft end 212E of the shaft 212.

The shaft indent 216 may include a surface contour with an arcuate bottom. The circular securing member 218 may be received around the shaft 212 and may be seated in the shaft indent 216 to secure the contact pad 108 to the end effector body 102. When the circular securing member 218 is seated in the shaft indent 216, the circular securing member 218 contacts a seating surface 214S of the recess 214 and also at least a part of the shaft indent 216. In the depicted embodiment, the circular securing member 218 comprises an O-ring that is compressed against the seating surface 214S in the as-installed condition. The O-ring may be manufactured from an elastomer material, such as a perfluoroelastomer available as KALREZ® from DUPONT PERFORMANCE ELASTOMERS, copolymers of hexafluoropropylene (HFP) and vinylidene fluoride (VDF or VF2) and available as VITON® from The Chemours Company, or any other suitable high-temperature elastomer. O-rings of elastomer may be used up to about 316° C.

Replaceable contact pad 108 configurations other than shown can be used. For instance, replaceable contact pads configured for high temperature use, such as from about 250° C. to about 650° C., or above about 320° C., may be used. In alternative embodiments, the shaft indent 216 may differ (e.g., in shape and/or dimensions and/or location), securing member 218 may differ (e.g., in shape and/or dimensions and/or location and/or material of constructions), any of the dimensions of any part of the contact pad may differ, the material of construction of the contact pad may differ, and so on.

In certain embodiments, the contact pad 108 can be made up of, include, or comprise any of the materials of construction listed above for the end effector body. For instance, in some embodiments, contact pad 108 may comprise glass, quartz, ceramic, or a conductive material (such as a metal material). Exemplary ceramics may comprise bulk alumina, alumina-SiC composites, SiC, silicon nitride, boron nitride, and boron. Exemplary conductive materials may comprise stainless steel, aluminum, nickel, copper, chromium, cobalt, molybdenum, ruthenium, tungsten, platinum, or other suitable metals or alloys (e.g., aluminum alloy A16061).

The coating described above with respect to FIG. 2 could be deposited on a top surface of an end effector body (such as end effector body 102) and on a contact surface of a contact pad head (such as 208H) of a contact pad deposited in the end effector body.

Figure 4:
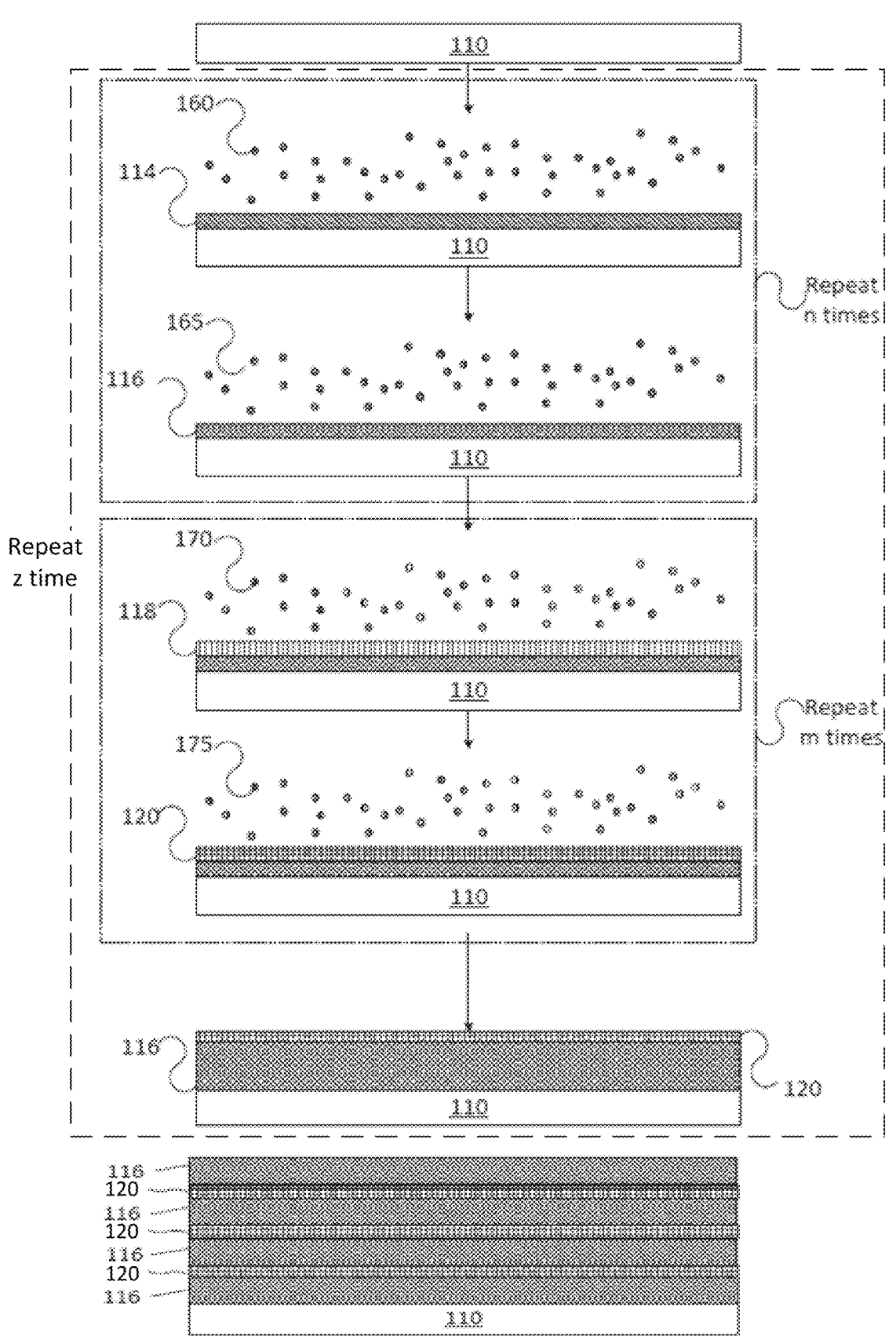
FIG. 4 depicts an atomic layer deposition process that may be used to coat an end effector body for a robot arm or another chamber component in accordance with embodiments of the present disclosure.

FIG. 4 depicts one embodiment of a deposition process in accordance with an ALD technique to deposit a coating on an article, such as a chamber component (e.g., an end effector body with or without contact pads). One or more chamber components to be coated with any of the coatings described herein (e.g., one or more end effectors) may be placed in controlled temperature-pressure deposition chamber prior to initiating a selected deposition process, such as ALD, CVD, PEALD, MOCVD, MBE, and so on.

Various types of ALD processes exist and the specific type may be selected based on several factors such as the surface to be coated, the coating material, chemical interaction between the surface and the coating material, etc. The general principle for the various ALD processes comprises growing a thin film layer by repeatedly exposing the surface to be coated to pulses of gaseous chemical precursors that chemically react with the surface one at a time in a self-limiting manner.

FIG. 4 illustrates an article 110 having a surface. Article 110 may represent a chamber component (such as an end effector body similar to end effector body 102 depicted in FIG. 1). For ALD, either adsorption of a precursor onto a surface or a reaction of a reactant with the adsorbed precursor may be referred to as a "half-reaction." During a first half reaction, a first material-containing precursor (such as metal-containing precursor) 160 is injected/pulsed onto the surface of the article 110 for a period of time sufficient to allow the precursor to fully adsorb onto the surface. The adsorption is self-limiting as the precursor will adsorb onto a finite number of available sites on the surface, forming a uniform, conformal, and continuous adsorption layer 114 on the surface. Any sites that have already adsorbed a precursor will become unavailable for further adsorption with the same precursor unless and/or until the adsorbed sites are subjected to a treatment that will form new available sites on the uniform, conformal, and continuous coating. Exemplary treatments may be plasma treatment, treatment by exposing the adsorption layer to radicals, or introduction of a different precursor able to react with the most recent layer adsorbed to the surface.

In some embodiments, two or more precursors are injected/pulsed together simultaneously or sequentially and adsorbed onto the surface of an article. The excess precursors are pumped/purged out with an inert gas. Thereafter a first reactant 165 (e.g., an oxygen-containing oxidizing/hydroxylating reactant, a nitrogen-containing reactant, a carbon-containing reactant and so on) is injected/pulsed to react with the adsorption layer 114 to form a first material-containing layer 116 (e.g., a first metal oxide layer or a multi-metal oxide layer). First material-containing layer 116 may be uniform, continuous, conformal, and have low porosity. Layer 116 may have a thickness of less than one atomic layer to a few atoms in some embodiments after a single ALD deposition cycle.

Multiple full ALD deposition cycles may be implemented to deposit a thicker layer 116, with each full cycle (e.g., including introducing precursor 160, flushing/purging, introducing reactant 165, and again flushing/purging) adding to the thickness by an additional fraction of an atom to a few atoms. As shown, up to n full cycles may be performed to grow layer 116 until a first target thickness is achieved, where n is an integer value greater than 1. In embodiments, layer 116 may have a first target thickness of about 5 angstroms to about 100 angstroms, about 10 angstroms to about 80 angstroms, or about 20 angstroms to about 50 angstroms. In some embodiments, the first target thickness may range from about 1 nm to about 1000 nm, from about 20 nm to about 500 nm, from about 20 nm to about 400 nm, from about 20 nm to about 300 nm, from about 20 nm to about 200 nm, from about 20 nm to about 100 nm, from about 50 nm to about 100 nm, or from about 20 nm to about 50 nm.

Subsequently, article 110 having first material-containing layer 116 may be introduced to an additional precursor(s), such as second material-containing precursor (e.g., second metal-containing precursor) 170 for a second duration to form a third half reaction and/or until a second adsorption layer 118 is formed. Subsequently, article 110 may be introduced to a second reactant 175 to react with adsorption layer 118 to form a fourth half reaction and/or to grow second material-containing layer 120. Layer 120 may be uniform, continuous, conformal, and have low porosity. Layer 120 may have a thickness of less than an atom to a few atoms (e.g., 2-3 atoms) after a single full cycle (e.g., including introducing precursor 170, flushing/purging, introducing reactant 175, and again flushing/purging). Multiple cycles may be implemented to deposit a thicker layer 120, with each cycle adding to the thickness by an additional fraction of an atom to a few atoms. As shown, the full cycle may be repeated m times to cause the layer 120 to have a second target thickness, where m is an integer value greater than 1. In embodiments, layer 120 may have a second target thickness of about 1 angstroms to about 50 angstroms, about 5 angstroms to about 30 angstroms, or about 10 angstroms to about 20 angstroms. In some embodiments, the second target thickness may range from about 1 nm to about 1000 nm, from about 20 nm to about 500 nm, from about 20 nm to about 400 nm, from about 20 nm to about 300 nm, from about 20 nm to about 200 nm, from about 20 nm to about 100 nm, from about 50 nm to about 100 nm, or from about 20 nm to about 50 nm.

The full ALD deposition cycle may be repeated z times until a total target thickness for the coating is achieved. The number of cycles z may be represented by a fraction or an integer having a value greater than 1 (e.g., 2-50, 5-30, 7-17, and any other number or range of numbers within these ranges). The total target thickness may range from about 1 nm to about 1000 nm, from about 20 nm to about 500 nm, from about 20 nm to about 400 nm, from about 20 nm to about 300 nm, from about 20 nm to about 200 nm, from about 20 nm to about 100 nm, from about 50 nm to about 100 nm, or from about 20 nm to about 50 nm. The final coating may comprise a stack alternating layers of first material-containing layer 116 and second material-containing layer 120.

The process described hereinabove of forming a stack of alternating layers may also be referred to herein as sequential deposition. Other ALD sequences, such as co-deposition or co-dosing may also be used herein (e.g., by co-injecting multiple metal-containing precursors or sequentially injecting multiple metal-containing precursors prior to introducing a reactant into the ALD deposition chamber).

After the stack of alternating layers has been formed, an anneal process may be performed to cause the alternating layers of different materials to diffuse into one another and form a complex coating (e.g., a complex oxide, a complex hydroxide, a complex nitride, a complex carbide, and so on) having a single crystalline/amorphous phase or multiple crystalline/amorphous phases in some embodiments. After the annealing process, the stack of alternating layers may become a single interdiffused coating layer (not shown in FIG. 4). For example, if the layers in the stack are $Y_2O_3$, $Al_2O_3$, and $ZrO_2$, then the resulting single interdiffused coating layer may be a ceramic compound comprising $Y_4Al_2O_9$ and a solid-solution of $Y_2O_3$—$ZrO_2$.

The ratio of n cycles (for depositing the first material-containing layers 116) to m cycles (for depositing the second material-containing layers 120) may be designated as n:m. n:m may correspond to the ratio of the first target thickness of each layer 116 to the second target thickness of each layer 120. n:m may also correspond to the composition ratio of the first material to the second material in coating 200.

In an embodiment, the coating 200 may be deposited on the top surface of an end effector body 102T (or top surface of other chamber components) with an ALD process as described in FIG. 4. The coating 200 may comprise an electrically-dissipative material that is a stack of alternating nano-layers 116 and 120 (also may be referred to herein as nanolaminates). The ratio of a thickness of each nano-layer 116 to a thickness of each nano-layer 120 in the stack may range from about 50:1 to about 1:50, from about 30:1 to about 1:30, from about 20:1 to about 1:20, from about 10:1 to about 1:10, from about 10:1 to about 1:1, from about 8:1 to about 1:1, from about 5:1 to about 1:1, from about 10:1 to about 2:1, from about 8:1 to about 2:1, from about 5:1 to about 2:1, or from about 5:2 to about 1:1.

The first target thickness of the first material-containing layers and the second target thickness of the second material-containing layer may independently vary from one deposition cycle to another deposition cycle. For instance, one layer of the first material-containing layer may be 5 nm in thickness and another layer of the first material-containing layer may be 7 nm in thickness. Similarly, one layer of the second material-containing layer may be 2 nm in thickness and another layer of the second material-containing layer may be 3 nm in thickness.

The deposition process temperature may correspond to the reactant composition in coating 200. In other words, the deposition process temperature may determine the amount of oxygen, hydrogen, nitrogen, carbon, and so on in the coating 200. ALD processes may be conducted at various temperatures depending on the type of process. The optimal temperature range for a particular ALD process is referred to as the "ALD temperature window." Temperatures below the ALD temperature window may result in poor growth rates and non-ALD type deposition. Temperatures above the ALD temperature window may result in reactions taken place via a chemical vapor deposition (CVD) mechanism. The ALD temperature window may range from about 80° C. to about 500° C., from about 100° C. to about 400° C. In some embodiments, the ALD temperature window is between about 100-300° C., or about 200° C.

The electrostatic dissipation of a chamber component (such as an end effector body) coated with coating 200 may be a function of the electrical surface resistivity (or sheet resistance) of the coating 200. The electrical surface/sheet resistivity of the coating 200 may be a function of the composition of the coating (e.g., n:m ratio and reactant composition/content) and the thickness of the coating (determined by the number of full ALD cycles-z value). For instance, a 50 nm thick alumina-titania nanolaminate with a 5 nm:2 nm ratio of alumina layer thickness to titania layer thickness had an electrical sheet resistance of about $1.6\times10^7$ ohm/sq, a 100 nm thick alumina-titania nanolaminate with a 5 nm:2 nm ratio of alumina layer thickness to titania layer thickness had an electrical surface/sheet resistance of about $9.4\times10^6$ ohm/sq, a 100 nm thick alumina-titania nanolaminate with a 5 nm:1 nm ratio of alumina layer thickness to titania layer thickness had an electrical sheet resistance of about $7.5\times10^7$ ohm/sq, with all electrical sheet resistances being measured per ASTM D-257 method.

As may be understood from the ALD process described hereinabove, coating 200 may be formed using an atomically precise, layer-by-layer approach to create nanolaminates with compositions and thicknesses that may be controlled in the sub-nanometer range.

In one embodiment, layer 116 may be alumina and layer 120 may be titania. Exemplary aluminum-containing precursors that may be used to deposit an alumina layer include, without limitations, trimethylaluminum (TMA), diethylaluminum ethoxide, tris(ethylmethylamido)aluminum, aluminum sec-butoxide, aluminum tribromide, aluminum trichloride, triethylaluminum (TEA), triisobutylaluminum, trimethylaluminum, or tris(diethylamido)aluminum.

Exemplary titanium-containing precursors that may be used to deposit a titania layer, include, without limitations, tetrakis(dimethylamido)titanium, tetrakis(ethylmethylamido)titanium, titanium tetrachloride, titanium ethoxide, titanium isopropoxide, methylcyclopentadienyl titanium isopropoxide, titanium dimethylaminoethoxide isopropoxide variants, tris(dimethylamido)ethylcyclopentadienyl titanium, cycloheptatrienyl cyclopentadienyl titanium, tris (methoxy)cyclopentadienyl titanium.

Other metal-containing precursors may be used depending on the composition of the coating 200.

Yttrium based coatings may be deposited by ALD using yttrium-containing precursors such as, without limitations, tris(N,N-bis(trimethylsilyl)amide)yttrium (III), yttrium (III) butoxide, tris(cyclopentadienyl)yttrium(III), and Y(thd)3 (thd=2,2,6,6-tetramethyl-3,5-heptanedionato).

Zirconium based coatings may be deposited by ALD using zirconium-containing precursors such as, without limitations, zirconium (IV) bromide, zirconium (IV) chloride, zirconium (IV) tert-butoxide, tetrakis(diethylamido) zirconium (IV), tetrakis(dimethylamido)zirconium (IV), or tetrakis(ethylmethylamido)zirconium (IV).

Hafnium based coatings may be deposited by ALD using hafnium-containing precursors such as, without limitations, $HfCl_4$, TEMAHf, TDMAHf, HfCp variants, ZrCp variants.

Erbium based coatings may be deposited by ALD using erbium-containing precursors that such as, without limitations, tris-methylcyclopentadienyl erbium (III) (Er(MeCp)$_3$), erbium boranamide (Er(BA)$_3$), Er(TMHD)$_3$, erbium(III) tris(2,2,6,6-tetramethyl-3,5-heptanedionate), and tris(butyl-cyclopentadienyl)erbium(III).

Exemplary oxidative reactants that may be used in the ALD process may include, without limitations, oxygen, oxygen radicals, water, ozone, alcohol reactants, and the like. Other exemplary reactants that may be used in the ALD process to form the stack of electrically dissipative layers may include, without limitations, reducing agents ($H_2$, $H_2$ plasma, metalorganic reagents such as aluminum hydride derivatives, silanes), nitriding agents (ammonia, amines, $N_2$), carburizing agents (alkanes), and the like.

Figure 5:
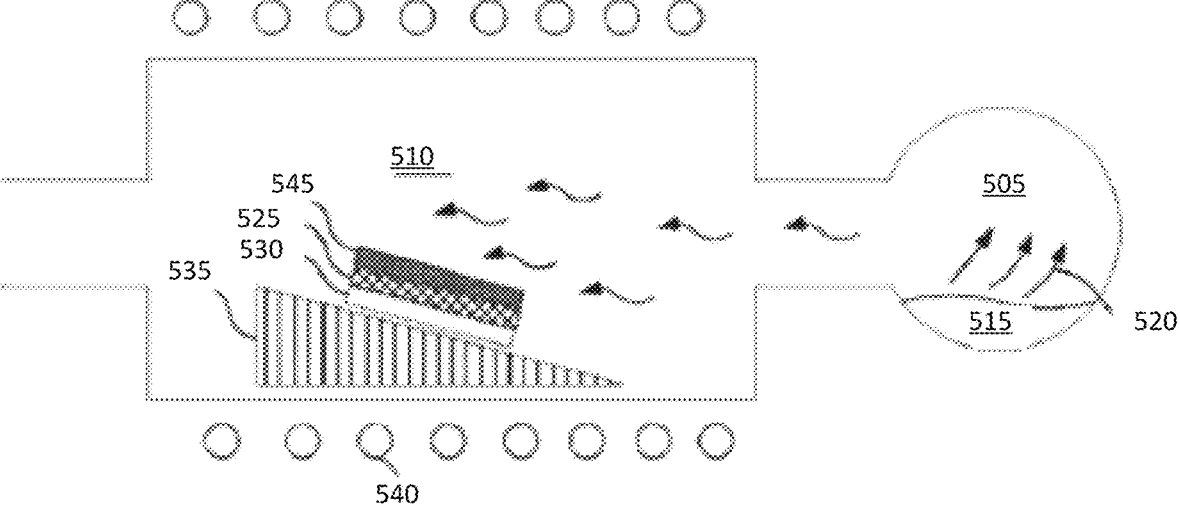
FIG. 5 depicts an exemplary chamber for a chemical vapor deposition process that may be used to coat an end effector body for a robot arm or another chamber component in accordance with embodiments of the present disclosure.

In some embodiments, the coating 200 may be deposited on a surface of a chamber component (e.g., an end effector body with or without contact pads) via a CVD process. An exemplary CVD system is illustrated in FIG. 5. The system comprises a chemical vapor precursor supply system 505 and a CVD reactor 510. The role of the vapor precursor supply system 505 is to generate vapor precursors 520 from a starting material 515, which could be in a solid, liquid, or gas form. The vapors may subsequently be transported into CVD reactor 510 and get deposited as a coating 525 and/or 545 on the surface of article 530 (such as, top surface of end effector body 102T), which may be positioned on article holder 535.

The coating depicted in FIG. 5 comprises a bilayer of layer 525 and layer 545. It is understood by one of ordinary skill in the art that although only a bilayer is exemplified with respect to the CVD process, a multilayer coating (such as a stack of more than two alternating layers) is also contemplated herein with respect to a CVD process. A multilayer coating comprising a stack of alternating layers of alumina and titania deposited by CVD are contemplated in certain embodiments herein.

CVD reactor 510 heats article 530 to a deposition temperature using heater 540. In some embodiments, the heater may heat the CVD reactor's wall (also known as "hot-wall reactor") and the reactor's wall may transfer heat to the article. In other embodiments, the article alone may be heated while maintaining the CVD reactor's wall cold (also known as "cold-wall reactor"). It is to be understood that the CVD system configuration should not be construed as limiting. A variety of equipment could be utilized for a CVD system and the equipment is chosen to obtain optimum processing conditions that may give a coating with uniform thickness, surface morphology, structure, and composition.

The various CVD techniques include the following phases: (1) generate active gaseous reactant species (also known as "precursors") from the starting material; (2) transport the precursors into the reaction chamber (also referred to as "reactor"); (3) absorb the precursors onto the heated article; (4) participate in a chemical reaction between the precursor and the article at the gas-solid interface to form a deposit and a gaseous by-product; and (5) remove the gaseous by-product and unreacted gaseous precursors from the reaction chamber.

Suitable CVD precursors may be stable at room temperature, may have low vaporization temperature, can generate vapor that is stable at low temperature, have suitable deposition rate (low deposition rate for thin film coatings and high deposition rate for thick film coatings), relatively low toxicity, be cost effective, and relatively pure. For some CVD reactions, such as thermal decomposition reaction (also known as "pyrolysis") or a disproportionation reaction, a chemical precursor alone may suffice to complete the deposition.

CVD has many advantages including its capability to deposit highly dense and pure coatings and its ability to produce uniform films with good reproducibility and adhesion at reasonably high deposition rates. Layers deposited using CVD in embodiments may have a porosity of below 1%, a porosity of below 0.1%, or be porosity free (e.g., 0% porosity). Therefore, it can be used to uniformly coat complex shaped components and deposit conformal films with good conformal coverage (e.g., with substantially uniform thickness). CVD may also be utilized to deposit a film made of a plurality of components, for example, by feeding a plurality of chemical precursors at a predetermined ratio into a mixing chamber and then supplying the mixture to the CVD reactor system.

The CVD processes contemplated herein may utilize some of the precursors listed above with respect to the ALD processes contemplated herein.

In certain embodiments, it may be preferred to deposit coating 200 using an ALD process over a CVD process.

Figure 6:
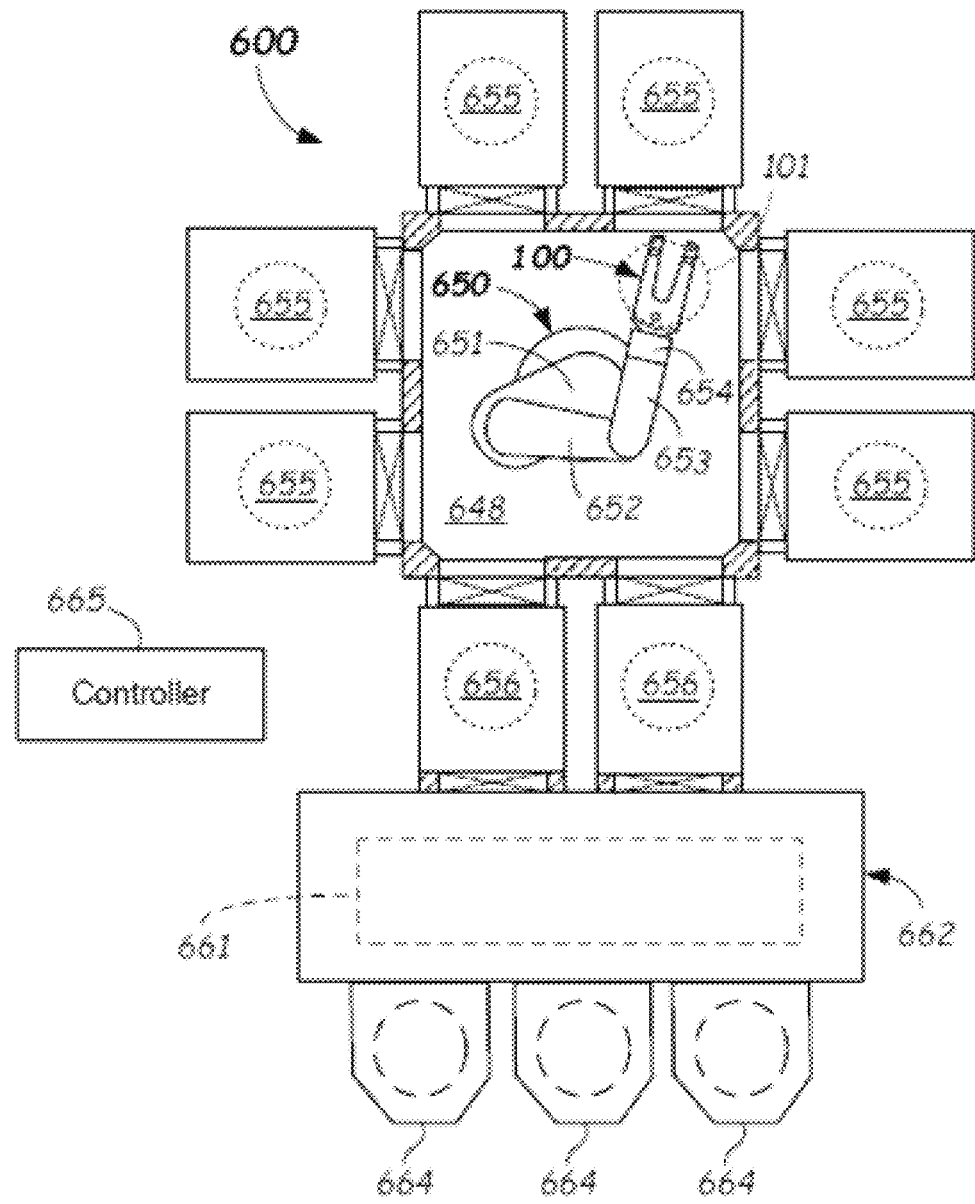
FIG. 6 illustrates a top schematic view of an electronic device manufacturing apparatus including a transfer robot having an end effector including replaceable contact pads that may be together coated in accordance with one or more embodiments of the present disclosure.

FIG. 6 illustrates an example embodiment of an electronic device processing tool 600 including a transfer robot 650 having an end effector 100 supporting a substrate 101 (shown dotted for illustration purposes) wherein the substrate 101 is supported on contact pads (integral or replaceable). End effector 100 (with or without the contact pad deposited thereon) may be coated with an electrically-dissipative material using an ALD, a CVD, an PEALD, or an MBE process as described herein. The electronic device processing tool 600 may include a number of processing chambers 655 (shown dotted) coupled to a transfer chamber 648. The transfer chamber 648 may house the transfer chamber (TC) robot 650. The TC robot 650 may have a first arm 651, a second arm 652, and a third arm 653 (e.g., a robot wrist). The end effector 100 is coupled to the third arm 653, such as through mounting plate 654. The end effector 100 may contact and support a substrate 101 thereon (e.g., a semiconductor wafer, glass plate, etc.).

The transfer chamber 648 of the processing tool 600 may be connected, via one or more load lock chambers 656, to a factory interface 662. The factory interface 662 may house a factory interface (FI) robot 661. The FI robot 661 may include an end effector (not shown, but substantially identical to end effector 100) and that can have replaceable contact pads 108 as described herein and may be coated with an electrically-dissipative material using an ALD or a CVD process as described herein.

Substrate carriers 664 may be detachably connected to a front wall of the factory interface 662 and substrates 101 therein may be moved by the FI robot 661 between the substrate carriers 664 and the one or more load lock chambers 656.

The processing tool 100 may be coupled to a controller 665. The controller 665 may control movement of the substrates 101 and processing thereof. The controller 665 may include a central processing unit (CPU), support circuits, and a memory, for example. In operation, the TC robot 650 may be operated, subject to commands from the controller 665, to move substrates 101 between the various process chambers 655 and the load lock chambers 656 or between different process chambers 655, for example.

As the manufacturing processes progress, the FI robot 661 and the TC robot 650, working in tandem, may move substrates 101 between the substrate carriers 664 and the processing chambers 655. Various electronic device fabrication processes, e.g., semiconductor device manufacturing processes, such as, e.g., oxidation, thin film deposition, etching, heat treatment, degassing, cool down, etc., may take place within the process chambers 655.

Though TC chamber robot 650 is described as having an end effector coated with an electrically-dissipative coating, the FI robot 661 may additionally or alternatively include an end effector with an electrically-dissipative coating.

In the foregoing description, numerous specific details are set forth, such as specific materials, dimensions, processes parameters, etc., to provide a thorough understanding of the present invention. The particular features, structures, materials, or characteristics may be combined in any suitable manner in one or more embodiments. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is simply intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. Reference throughout this specification to "an embodiment", "certain embodiments", or "one embodiment" means that a particular feature, structure, or characteristic described in connection with the embodiment is included in at least one embodiment. Thus, the appearances of the phrase "an embodiment", "certain embodiments", or "one embodiment" in various places throughout this specification are not necessarily all referring to the same embodiment.

The present invention has been described with reference to specific exemplary embodiments thereof. The specification and drawings are, accordingly, to be regarded in an illustrative rather than a restrictive sense. Various modifications of the invention in addition to those shown and described herein will become apparent to those skilled in the art and are intended to fall within the scope of the appended claims.

We claim:

1. A coated chamber component, comprising:
   a chamber component; and a multi-layer coating deposited on a surface of the chamber component, the multi-layer coating comprising an electrically-dissipative material, wherein the electrically-dissipative material is to provide a dissipative path from the multi-layer coating to a ground, wherein the multi-layer coating is continuous on an entirety of the surface of the chamber component to protect the surface of the chamber component, wherein the multi-layer coating has a thickness ranging from about 10 nm to about 900 nm, and wherein the multi-layer coating comprises one or more first continuous material-containing layers on the entirety of the surface of the chamber component and one or more second continuous material-containing layers on the entirety of the surface of the chamber component.

2. The coated chamber component of claim 1, wherein the multi-layer coating has an electrical surface/sheet resistance ranging from about $1 \times 10^5$ ohm/sq to about $1 \times 10^{11}$ ohm/sq.

3. The coated chamber component of claim 2, wherein the electrical surface/sheet resistance of the multi-layer coating remains unchanged after thermal cycling at a temperature ranging from about 300° C. to about 700° C.

4. The coated chamber component of claim 2, wherein the electrical surface/sheet resistance of the multi-layer coating is uniform as evidenced by electrical surface/sheet resistance variations across the multi-layer coating of less than about ±35%.

5. The coated chamber component of claim 1, wherein the one or more first continuous material-containing layers consist of a metal or a metal alloy comprising at least one of Al, Y—Zr, Mg—Al, or Ca—Al, and the one or more second continuous material-containing layers consist of a transition metal, a rare earth, a main group metal, a semiconductor, or an alloy thereof.

6. The coated chamber component of claim 1, wherein the electrically-dissipative material comprises an alternating stack of the one or more first continuous material-containing layers and the one or more second continuous material-containing layers.

7. The coated chamber component of claim 6, wherein the one or more second continuous material-containing layers consist of one or more of Ti, Fe, Co, Cu, Ni, Mn, V, Y, Nb, In, Sn, Fe—Co, or La—Ta.

8. The coated chamber component of claim 6, wherein a ratio of a thickness of each first continuous material-containing layer to a thickness of each second continuous material-containing layer in the alternating stack ranges from about 10:1 to about 1:1.

9. The coated chamber component of claim 6, wherein the one or more first continuous material-containing layers comprise Al and the one or more second continuous material-containing layers comprise Ti.

10. The coated chamber component of claim 1, wherein the multi-layer coating has a thickness ranging from about 20 nm to about 500 nm.

11. The coated chamber component of claim 1, wherein the chamber component comprises an electrically-conductive material, a ceramic, a polymer, or quartz.

12. The coated chamber component of claim 1, wherein the multi-layer coating has a Vickers hardness ranging from about 500 kg/mm² to about 1000 kg/mm².

13. The coated chamber component of claim 1, wherein the multi-layer coating is resistant to corrosive plasma.

14. The coated chamber component of claim 1, wherein the chamber component comprises a conductive material that is a metal.

15. The coated chamber component of claim 1, wherein the chamber component comprises a ceramic that is alumina.

16. The coated chamber component of claim 1, wherein the electrically-dissipative material comprises alumina, titania, or a combination thereof.

17. The coated chamber component of claim 1, wherein the multi-layer coating is also a corrosion resistant coating and protects the entirety of the surface of the chamber component from corrosion.

18. A coated chamber component, comprising:
a chamber component; and
a coating deposited on a surface of the chamber component, the coating comprising an electrically-dissipative material, wherein the electrically-dissipative material is to provide a dissipative path from the coating to a ground;

wherein the coating comprises one or more first material-containing layers that comprise aluminum hydroxide and one or more second material-containing layers that comprise metallic titanium; and wherein the coating is uniform, conformal, and has a thickness ranging from about 10 nm to about 900 nm.

19. A method comprising:
depositing a multi-layer coating onto a surface of a chamber component using an atomic layer deposition (ALD) process, a chemical vapor deposition (CVD) process, a plasma enhanced atomic layer deposition (PEALD) process, a metal organic chemical vapor deposition (MOCVD) process, or a molecular beam epitaxy (MBE) process, the multi-layer coating comprising an electrically-dissipative material, wherein the electrically-dissipative material is to provide a dissipative path from the multi-layer coating to ground, wherein the multi-layer coating is continuous on an entirety of the surface of the chamber component to protect the surface of the chamber component, wherein the multi-layer coating comprises one or more first continuous material-containing layers on the entirety of the surface of the chamber component and one or more second continuous material-containing layers on the entirety of the surface of the chamber component, and wherein the multi-layer coating has a thickness ranging from about 10 nm to about 900 nm.

20. The method of claim 19, wherein the one or more first continuous material-containing layers consist of a metal or a metal alloy comprising at least one of Al, Y—Zr, Mg—Al, or Ca—Al, and the one or more second continuous material-containing layers consist of a transition metal, a rare earth, a main group metal, a semiconductor, or an alloy thereof.

* * * * *